United States Patent
Tanaka et al.

(10) Patent No.: US 10,680,639 B2
(45) Date of Patent: Jun. 9, 2020

(54) CIRCUIT DEVICE, VIBRATION DEVICE, ELECTRONIC APPARATUS, AND VEHICLE

(71) Applicant: Seiko Epson Corporation, Tokyo (JP)

(72) Inventors: Atsushi Tanaka, Minowa (JP); Fumikazu Komatsu, Okaya (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/225,805

(22) Filed: Dec. 19, 2018

(65) Prior Publication Data

US 2019/0207621 A1  Jul. 4, 2019

(30) Foreign Application Priority Data

Dec. 28, 2017 (JP) ................... 2017-254043

(51) Int. Cl.
| | |
|---|---|
| H03M 3/00 | (2006.01) |
| H03F 3/45 | (2006.01) |
| H03L 1/02 | (2006.01) |
| H03M 1/80 | (2006.01) |

(52) U.S. Cl.
CPC ............. *H03M 3/464* (2013.01); *H03F 3/45* (2013.01); *H03F 3/45475* (2013.01); *H03L 1/022* (2013.01); *H03M 1/804* (2013.01); *H03M 3/426* (2013.01); *H03M 3/474* (2013.01); *H03F 2203/45156* (2013.01); *H03F 2203/45512* (2013.01); *H03F 2203/45551* (2013.01)

(58) Field of Classification Search
CPC .................. H03M 3/464; H03M 1/804; H03F 2203/45156; H03F 2203/45551
See application file for complete search history.

(56) References Cited

U.S. PATENT DOCUMENTS

| | | | | |
|---|---|---|---|---|
| 2011/0260899 A1* | 10/2011 | Snedeker | ............ | H03M 1/1047 341/118 |
| 2012/0280846 A1* | 11/2012 | Lin | ....... | H03M 1/002 341/172 |
| 2015/0263756 A1* | 9/2015 | Chiu | ...... | H03M 1/468 341/118 |
| 2018/0219558 A1* | 8/2018 | Chiu | ...... | H03M 3/452 |

FOREIGN PATENT DOCUMENTS

JP   H11-004166 A   1/1999

* cited by examiner

*Primary Examiner* — Jeffrey M Shin
(74) *Attorney, Agent, or Firm* — Harness, Dickey & Pierce, P.L.C.

(57) ABSTRACT

A circuit device includes an A/D converter circuit that performs A/D conversion by successive approximation using a charge redistribution type D/A converter circuit having capacitor array circuits on the positive electrode side and the negative electrode side, and quantization error hold circuits that hold charges corresponding to a quantization error in the A/D conversion. The quantization error hold circuits include quantization error hold circuits on the positive electrode side and the negative electrode side having one ends connected to sampling nodes of the capacitor array circuits on the positive electrode side and the negative electrode side. The quantization error hold circuits on the positive electrode side and the negative electrode side are placed on a second direction side orthogonal to a first direction in which the capacitor array circuits on the positive electrode side and the negative electrode side are placed.

17 Claims, 14 Drawing Sheets

CIRCUIT DEVICE, VIBRATION DEVICE, ELECTRONIC APPARATUS, AND VEHICLE

BACKGROUND

1. Technical Field

The present invention relates to a circuit device, a vibration device, an electronic apparatus, a vehicle, and the like.

2. Related Art

Successive approximation type A/D converter circuits that perform A/D conversion on an input signal by comparing the voltage of the input signal with the D/A converted voltage of the successive approximation data, updating the successive approximation data based on the comparison result, and repeatedly performing this comparison and updating by a technique such as a binary search or the like have been known in the related art. While the successive approximation type A/D converter circuit has low power consumption, it is difficult to increase the accuracy (for example, to increase the number of valid bits) as compared with, for example, a delta sigma type A/D converter circuit or the like.

As a technique for increasing the accuracy of the successive approximation type A/D converter circuit, for example, there is a technique disclosed in JP-A-11-4166. In JP-A-11-4166, a hybrid type A/D converter circuit is configured by adopting a delta sigma type configuration in the successive approximation type A/D converter circuit, and quantization noise in a low frequency band is reduced by a noise shaping effect to achieve high accuracy.

In the related art, a layout of a hybrid type A/D converter circuit is not disclosed or suggested. For example, the A/D converter circuit disclosed in JP-A-11-4166 has a single-ended configuration, and the layout thereof is neither disclosed nor suggested. As a technique for improving the accuracy (for example, to increase an S/N ratio) of the A/D converter circuit, a method by a differential configuration is conceivable, but JP-A-11-4166 is a single-ended configuration, neither disclosing nor suggesting the circuit configuration and layout in the case of the differential configuration.

SUMMARY

An advantage of some aspects of the invention is to solve at least a part of the problems described above, and the invention can be implemented as the following forms or embodiments.

An aspect of the invention relates to a circuit device including an A/D converter circuit that includes a charge redistribution type D/A converter circuit and performs A/D conversion of an input voltage by successive approximation using the D/A converter circuit and a quantization error hold circuit that holds a charge corresponding to a quantization error in the A/D conversion of the input voltage, in which the D/A converter circuit includes a capacitor array circuit on a positive electrode side and a capacitor array circuit on a negative electrode side, the A/D converter circuit includes a comparator circuit having a first input node connected to a sampling node on the positive electrode side serving as a sampling node of the capacitor array circuit on the positive electrode side and having a second input node connected to a sampling node on the negative electrode side serving as a sampling node of the capacitor array circuit on the negative electrode side, the quantization error hold circuit includes a quantization error hold circuit on the positive electrode side having one end connected to the sampling node on the positive electrode side and a quantization error hold circuit on the negative electrode side having one end connected to the sampling node on the negative electrode side, the capacitor array circuit on the positive electrode side and the capacitor array circuit on the negative electrode side are placed along a first direction, when a direction orthogonal to the first direction is defined as a second direction, the quantization error hold circuit on the positive electrode side is placed on the second direction side of the capacitor array circuit on the positive electrode side, and the quantization error hold circuit on the negative electrode side is placed on the second direction side of the capacitor array circuit on the negative electrode side.

According to the aspect of the invention, it is possible to symmetrically place circuits on a positive electrode side (capacitor array circuit on positive electrode side and quantization error hold circuit on positive electrode side) and circuits on a negative electrode side (capacitor array circuit on negative electrode side and quantization error hold circuit on negative electrode side) which are differential configurations by placing the capacitor array circuits on the positive electrode side and the negative electrode side along the first direction and placing the quantization error hold circuits on the positive electrode side and the negative electrode side on respective second direction sides. In addition, the quantization error hold circuits on the positive electrode side and the negative electrode side are placed on the second direction side of the capacitor array circuits on the positive electrode side and the negative electrode side, whereby it is possible to connect between one ends of the quantization error hold circuits on the positive electrode side and the negative electrode side and the sampling nodes of the capacitor array circuits on the positive electrode side and the negative electrode side with a short wiring length. In this manner, according to the aspect of the invention, it is possible to place a layout of a hybrid type A/D converter circuit of differential configuration efficiently from the viewpoint of circuit area and signal transmission.

In the aspect of the invention, the comparator circuit may be placed between the capacitor array circuit on the positive electrode side and the capacitor array circuit on the negative electrode side.

As described above, the sampling nodes of the capacitor array circuits on the positive electrode side and negative electrode side are connected to first and second input nodes of the comparator circuit. According to the aspect of the invention, a comparator circuit is placed between capacitor array circuits on the positive electrode side and the negative electrode side, whereby it is possible to wire sampling nodes with a short wiring length. In addition, according to the aspect of the invention with the configuration described above, the sampling nodes are wired between the capacitor array circuits on the positive electrode side and the negative electrode side and the comparator circuit, whereby it is possible to connect one ends of the quantization error hold circuits on the positive electrode side and the negative electrode side provided on the second direction side of the capacitor array circuits on the positive electrode side and the negative electrode side to the sampling nodes with a short wiring length.

In the aspect of the invention, the A/D converter circuit may include an adder circuit to which an input voltage on the positive electrode side and an input voltage on the negative electrode side are input as the input voltages, in which the adder circuit may output a voltage obtained by adding the input voltage on the positive electrode side and a voltage corresponding to a charge held in the quantization error hold circuit on the negative electrode side to the capacitor array circuit on the positive electrode side and output a voltage obtained by adding the input voltage on the negative side and a voltage corresponding to a charge held in the quantization error hold circuit on the positive electrode side to the capacitor array circuit on the negative electrode side.

According to the aspect of the invention with this configuration, the output voltage of the adder circuit is a voltage obtained by subtracting the difference between the voltage corresponding to the charge held in the quantization error hold circuit on the positive electrode side and the voltage corresponding to the charge held in the quantization error hold circuit on the negative electrode side from the difference between the input voltage on the positive electrode side and the input voltage on the negative electrode side. That is, it is possible to realize a hybrid type A/D converter circuit incorporating a delta sigma type configuration by performing A/D conversion on this output voltage. That is, the quantization error (charges) held in the quantization error hold circuits on the positive electrode side and the negative electrode side is fed back to the input voltages on the positive electrode side and the negative electrode side by the adder circuit.

In the aspect of the invention, the adder circuit may include an operational amplifier having an inverting input node connected to the other end of the quantization error hold circuit on the positive electrode side and having a non-inverting input node connected to the other end of the quantization error hold circuit on the negative electrode side, and the operational amplifier may be placed between the quantization error hold circuit on the positive electrode side and the quantization error hold circuit on the negative electrode side.

According to the aspect of the invention, the operational amplifier is placed between the quantization error hold circuits on the positive electrode side and the negative electrode side, whereby it is possible to wire between an inverting input node and the other end of the quantization error hold circuit on the positive electrode side and between a non-inverting input node and the other end of the quantization error hold circuit on the negative electrode side with a short wiring length. In addition, according to the aspect of the invention, the operational amplifier is placed on the second direction side of the comparator circuit, the capacitor array circuits on the positive electrode side and on the negative electrode side are placed with the comparator circuit interposed therebetween, and the quantization error hold circuits on the positive electrode side and the negative electrode side are placed with the operational amplifier interposed therebetween. As a result, it is possible to symmetrically place the hybrid type A/D converter circuit of differential configuration, and it is possible to efficiently place the layout from the viewpoint of circuit area and signal transmission.

In the aspect of the invention, the circuit device may include a selector that receives first to n-th voltages (n is an integer of 2 or more) to output any one of the first to n-th voltages as the input voltages, in which the quantization error hold circuit on the positive electrode side may include first to n-th hold circuits on the positive electrode side that hold charges corresponding to the first to n-th voltages, and the quantization error hold circuit on the negative electrode side may include first to n-th hold circuits on the negative electrode side that hold charges corresponding to the first to n-th voltages.

According to the aspect of the invention, a charge corresponding to a quantization error in the A/D conversion of the voltage VIi may be held by an i-th hold circuit on the positive electrode side and an i-th hold circuit on the negative electrode side.

In the aspect of the invention, the first to n-th hold circuits on the positive electrode side may be placed along the second direction, and the first to n-th hold circuits on the negative electrode side may be placed along the second direction.

When the number of input channels to the A/D converter circuit is changed, the number (n value) of hold circuits on the positive electrode side and the negative electrode side changes accordingly. According to the aspect of the invention, since the first to n-th hold circuits on the positive electrode side and the first to n-th hold circuits on the negative electrode side are placed along the second direction, it is possible to change the layout by shortening or extending the layout size in the second direction according to a change in the number of hold circuits. In this manner, according to the aspect of the invention, even in a case where the number of hold circuits on the positive electrode side and the negative electrode side is changed, it is possible to efficiently change the layout by using the existing circuit design.

In the aspect of the invention, the A/D converter circuit may use charges held in an i-th hold circuit on the positive electrode side and an i-th hold circuit on the negative electrode side as charges corresponding to a quantization error in (k−1)th (k is an integer of 2 or more) A/D conversion of an i-th voltage (i is an integer from 1 to n) to perform k-th A/D conversion on the i-th voltage, and output A/D conversion result data in which the quantization error is noise-shaped.

According to the aspect of the invention, by performing the A/D conversion of the i-th voltage by a successive approximation operation using a charge redistribution type D/A converter circuit, after the successive approximation operation is completed, the D/A converter circuit may output a voltage corresponding to the quantization error in the (k−1)th A/D conversion for the i-th voltage. The i-th hold circuit on the positive electrode side and the i-th hold circuit on the negative electrode side hold charges based on these voltages, whereby it is possible to hold the charges corresponding to the quantization error in the (k−1)th A/D conversion with respect to the i-th voltage. It is possible to perform noise shaping of the quantization error by using this charge to perform the k-th A/D conversion on the i-th voltage. In the aspect of the invention, it is possible to cope with multichannel input by providing hold circuits on the positive electrode side and the negative electrode side corresponding to each channel. As described above, it is possible to achieve both high accuracy of A/D conversion by the noise shaping effect and multichannel input.

In the aspect of the invention, first to m-th temperature detection voltages from the first to m-th temperature sensors (m is an integer from 1 to n) may be input to the selector as first to m-th voltages of the first to n-th voltages.

As processing using temperature detection data (A/D conversion result data of temperature detection voltage), various processing in the vibration device may be assumed. Temperature compensation processing of an oscillation frequency in a digital oscillator such as a TCXO or an OCXO may be considered. Alternatively, processing for correcting a temperature-dependent error in a physical quantity measurement apparatus (for example, zero-point correction in a gyro sensor) may be considered. At this time, there is a possibility that the temperature of the vibrator is estimated with high accuracy by providing a plurality of temperature sensors at a plurality of positions of the oscillator and the physical quantity measurement apparatus. In the aspect of the invention, since it is possible to construct a hybrid A/D converter circuit coping with multichannel input, it is possible to perform A/D conversion with high accuracy (highly accurate temperature detection) for the multichannel input from the plurality of temperature sensors.

In the aspect of the invention, the circuit device may include a digital signal processing circuit that outputs frequency control data based on the A/D conversion result data corresponding to the input voltage which is a temperature detection voltage and an oscillation signal generator circuit that generates an oscillation signal of an oscillation frequency corresponding to the frequency control data by using a vibrator.

Since the change in temperature is gentle, the signal band of the temperature detection voltage becomes a low frequency band. Therefore, even with a comparatively low speed A/D converter circuit such as the successive approximation type, it is possible to perform A/D conversion with a sufficiently higher conversion rate than the signal band. In the aspect of the invention, it is possible to realize A/D conversion accompanied by the noise shaping effect as described above and to measure high S/N in the signal band of the temperature sensor by constructing a hybrid type A/D converter circuit.

Another aspect of the invention relates to a vibration device including any of the circuit devicees described above and a vibrator that is connected to the circuit device.

Still another aspect of the invention relates to an electronic apparatus including any of the circuit devicees described above.

Still another aspect of the invention relates to a vehicle including any of the circuit devicees described above.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail. The present embodiment described below does not unduly limit the contents of the invention described in the appended claims, and not all of the configurations described in the embodiment are necessarily indispensable as a solving means of the invention.

1. First Circuit Configuration Example

Figure 1:
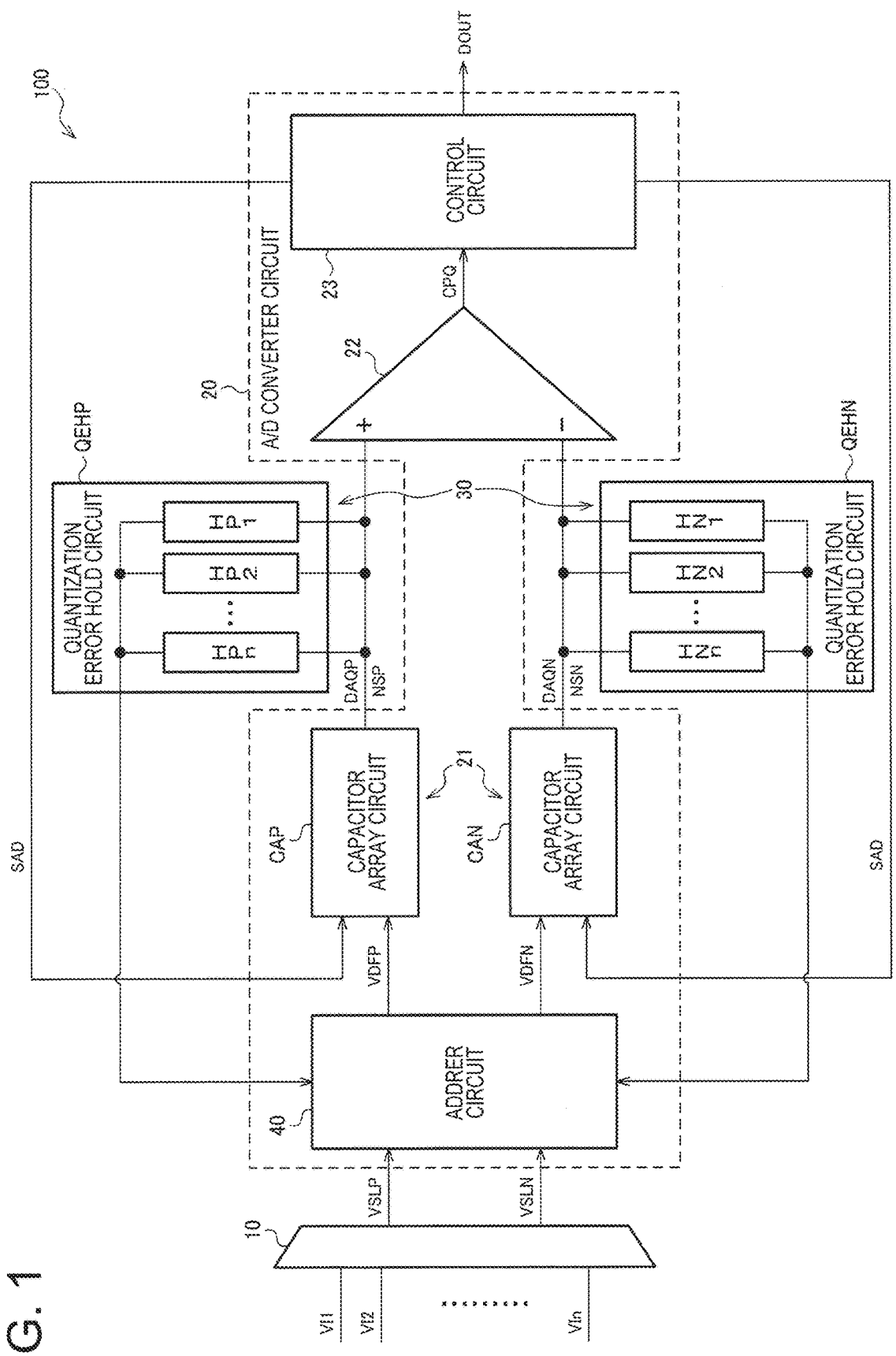
FIG. 1 is a first circuit configuration example of a circuit device.

FIG. 1 shows an example of a first circuit configuration of a circuit device 100. The circuit device 100 includes an A/D converter circuit 20 and a quantization error hold circuit 30. Further, the circuit device 100 may include a selector 10.

Voltages VI1 to VIn (first to n-th voltages (n is an integer of 2 or more)) are input to the selector 10, and the selector 10 selects any one of the voltages VI 1 to VIn to output the voltage as output voltages VSLP and VSLN. Each of the voltages VI1 to VIn is a differential voltage signal consisting of a first voltage signal and a second voltage signal, and the first and second voltage signals of the voltage selected by the selector 10 are output as the output voltages VSLP and VSLN. Specifically, the selector 10 sequentially selects the voltages VI1 to VIn in a time division manner and outputs the voltages selected for the time division as the output voltages VSLP and VSLN. The voltages VI1 to VIn are voltages to be subjected to A/D conversion and are, for example, output voltage signals of the sensor. In a case where only one differential voltage signal is input to the A/D converter circuit 20, the selector 10 may be omitted.

The A/D converter circuit 20 includes a charge redistribution type D/A converter circuit 21 and a comparator circuit 22. The output voltages VSLP and VSLN of the selector 10 are input to the A/D converter circuit 20 as input voltages. The A/D converter circuit 20 performs A/D conversion of the input voltages (VSLP and VSLN) by successive comparison using the D/A converter circuit 21 and outputs A/D conversion result data DOUT corresponding to the input voltages.

The D/A converter circuit 21 performs D/A conversion of successive approximation data SAD by charge redistribution between capacitors based on the successive approximation data SAD. The D/A converter circuit 21 includes a capacitor array circuit CAP (capacitor array circuit on positive electrode side) and a capacitor array circuit CAN (capacitor array circuit on negative electrode side). The positive side (non-inverting side and normal rotation side) is the side connected to the non-inverting input node of the comparator circuit 22, and the negative electrode side (inverting side) is the side connected to the inverting input node of the comparator circuit 22. In the configuration example of FIG. 1, the capacitor array circuit CAP and the quantization error hold circuit QEHP are circuits on the positive electrode side, the capacitor array circuit CAN and the quantization error hold circuit QEHN are circuits on the negative electrode side.

The capacitor array circuit CAP outputs the difference between the D/A converted voltage of the successive approximation data SAD and the voltage to be compared successively as a voltage DAQP by performing D/A conversion on the successive approximation data SAD.

The capacitor array circuit CAN outputs the difference between the D/A converted voltage of the successive approximation data SAD and the voltage to be compared successively as a voltage DAQN by performing D/A conversion on the successive approximation data SAD.

A first input node (non-inverting input node) of the comparator circuit 22 is connected to a sampling node NSP (sampling node on positive electrode side) of the capacitor array circuit CAP. A second input node (inverting input node) of the comparator circuit 22 is connected to the sampling node NSN (sampling node on the negative electrode side) of the capacitor array circuit CAN. The comparator circuit 22 makes a comparison determination between the voltages to be successively compared (output voltage VDFP and VDFN of an adder circuit 40) and the D/A converted voltages of the successive approximation data SAD based on the differential voltage DAQP and DAQN from the D/A converter circuit 21. Since the differential voltage DAQP and DAQN is a differential voltage signal, the comparator circuit 22 determines whether the differential voltage signal is positive or negative (positive or negative of DAQP-DAQN) and outputs the determination result as a signal CPQ.

The quantization error hold circuit 30 holds a charge corresponding to the quantization error in the A/D conversion of the input voltages (VSLP and VSLN) of the A/D converter circuit 20. The quantization error is the difference between the voltage (VDFP and VDFN) to be successively compared and the D/A converted voltage of the A/D conversion result data DOUT and is the output voltage of the D/A converter circuit 21 when SAD=DOUT is input to the D/A converter circuit 21. Specifically, the quantization error hold circuit 30 includes a quantization error hold circuit QEHP (quantization error hold circuit on positive electrode side) having one end connected to the sampling node NSP and a quantization error hold circuit QEHN (quantization error hold circuit on negative electrode side) having one end connected to the sampling node NSN.

The quantization error hold circuit QEHP holds the charge corresponding to the quantization error by holding the output voltage (DAQP) of the D/A converter circuit 21 with the capacitor. The quantization error hold circuit QEHP includes hold circuits HP1 to HPn (first to n-th hold circuits on positive electrode side) that hold charges corresponding to quantization errors in A/D conversion of the voltages VI1 to VIn. A charge corresponding to a quantization error in the A/D conversion when the selector 10 selects the voltage VIi (an i-th voltage (i is an integer from 1 to n)) is held by the hold circuit HPi (an i-th hold circuit on positive electrode side).

The quantization error hold circuit QEHN holds a charge corresponding to a quantization error by holding the output voltage (DAQN) of the D/A converter circuit 21 with the capacitor. The quantization error hold circuit QEHN includes hold circuits HN1 to HNn (first to n-th hold circuits on negative electrode side) that hold charges corresponding to quantization errors in the A/D conversion of the voltages VI1 to VIn. The hold circuit HNi (the i-th hold circuit on negative electrode side) holds a charge corresponding to a quantization error in the A/D conversion when the selector 10 selects the voltage VIi.

The A/D converter circuit 20 uses the charges held in the hold circuits HPi and HNi as charges corresponding to the quantization error in (k−1)th (k is an integer) A/D conversion of the voltage VIi to perform k-th A/D conversion on the voltage VIi. Then, the A/D converter circuit 20 outputs the A/D conversion result data DOUT corresponding to the voltage VIi, in which the quantization error is noise-shaped. That is, when the selector 10 selects the voltage VIi, and when the hold circuits HPi and HNi hold the charges corresponding to the quantization error and then the selector 10 selects the voltage VIi, A/D conversion is performed on the input voltages (VSLP and VSLN) by using the charges held by the hold circuits HPi and HNi. The A/D converter circuit 20 obtains the A/D conversion result data DOUT corresponding to the difference voltage between the input voltage and the voltage corresponding to the charges held by the hold circuits HPi and HNi. As a result, a primary noise shaping effect is achieved with respect to the quantization error.

According to the above embodiment, it is possible to obtain the A/D conversion result data DOUT corresponding to the voltage VIi, in which the quantization error in the A/D conversion is noise-shaped. That is, it is possible to realize a hybrid type A/D converter circuit incorporating a delta sigma type configuration in the successive approximation type A/D converter circuit with a differential configuration.

In addition, it is possible to realize multichannel input in the hybrid type A/D converter circuit by providing the hold circuits HP1 to HPn and HN1 to HNn that hold the charges corresponding to the quantization errors in the A/D conversion of the voltages VI1 to VIn. Specifically, since the charge redistribution type D/A converter circuit 21 performs the successive approximation operation so that the voltage to be successively compared and the D/A converted voltage of the successive approximation data SAD are equal, after the successive approximation operation is completed, a voltage corresponding to the quantization error may be output to the D/A converter circuit 21. By the voltage corresponding to this quantization error, the charge corresponding to the quantization error may be held. It is possible to hold the charge corresponding to the quantization error for each channel in the hold circuits HP1 to HPn and HN1 to HNn by holding a charge for each of the voltages VI1 to VIn.

A more detailed configuration and operation of the A/D converter circuit 20 will be described below. The A/D converter circuit 20 includes a control circuit 23 (logic circuit). In addition, the A/D converter circuit 20 may include the adder circuit 40.

The adder circuit 40 outputs the voltages (VDFP and VDFN) obtained by subtracting the voltage corresponding to the charges held in the hold circuits HPi and HNi from the voltages corresponding to the input voltages (VSLP and VSLN) to the D/A converter circuit 21. For example, the input voltage and the voltage having the opposite sign (for example, multiplied by −1) corresponding to the charges held in the hold circuits HPi and HNi are added. Specifically, the adder circuit 40 outputs the voltage VDFP obtained by adding the input voltage VSLP and the voltage corresponding to the charge held in the hold circuit HNi (quantization error hold circuit QEHN) to the capacitor array circuit CAP and outputs the voltage VDFN obtained by adding the input voltage VSLN and the voltage corresponding to the charge held in the hold circuit HPi (quantization error hold circuit QEHP) to the capacitor array circuit CAN. As a result, a voltage obtained by subtracting the difference between the voltage corresponding to the charge held in the hold circuit HPi and the voltage corresponding to the charge held in the hold circuit HNi is subtracted from the difference between the input voltage VSLP and the input voltage VSLN is output to the D/A converter circuit 21. The voltages corresponding to the charges held in the hold circuits HPi and HNi are the output voltages (DAQP and DAQN) of the D/A converter circuit 21 after the successive approximation operation is completed in the previous A/D conversion of the voltage VIi.

The D/A converter circuit 21 samples and holds the output voltage VDFP and VDFN of the adder circuit 40 and performs D/A conversion on the successive approximation data SAD by charge redistribution. As a result, the differential voltages DAQP and DAQN obtained by subtracting the output voltages VDFP and VDFN of the adder circuit 40 from the D/A converted voltage of the successive approximation data SAD are output.

The hold circuits HPi and HNi hold charges corresponding to the differential voltages DAQP and DAQN after the successive approximation operation on the voltage VIi is completed. For example, the charge charged in the capacitor is held by the potential difference between the common voltage and the differential voltages DAQP and DAQN by holding the differential voltages DAQP and DAQN with the capacitors with reference to the common voltage (given voltage).

In the above configuration, the output voltages (DAQP and DAQN) of the D/A converter circuit 21 becomes the residual voltages due to the quantization error by setting SAD=DOUT after the successive approximation operation is completed. The hold circuits HPi and HNi may hold charges corresponding to the quantization error only by holding charges corresponding to the residual voltages. By using these charges, feedback of the residual voltages due to the quantization error to the input side enables noise shaping of the quantization error. In the configuration of the present embodiment, since the residual voltages due to the quantization error are influenced by the past residual voltages, an operation corresponding to integration in the delta sigma operation is realized, and there is no need to provide an integrator. Therefore, when dealing with the multichannel input, it suffices to provide only quantization error hold circuits for the number of channels. Since it is unnecessary to provide an integrator (amplifier) for the number of channels, it is possible to reduce an increase in power consumption and an increase in circuit scale due to the multichannel input.

The comparator circuit 22 determines whether the differential voltages DAQP and DAQN (differential voltage signals) between an output voltage VDF of the adder circuit 40 and the D/A converted voltage of the successive approximation data SAD are positive and negative to output the determination result as a signal CPQ.

The control circuit 23 updates the successive approximation data SAD based on the comparison result (CPQ) by the comparator circuit 22 and outputs the updated successive approximation data SAD to the D/A converter circuit 21. Specifically, the control circuit 23 includes a register for storing the successive approximation data SAD. The control circuit 23 sets the successive approximation data SAD for comparison in the register, outputs the successive approximation data SAD for comparison to the D/A converter circuit 21, and determines the successive approximation data SAD based on the comparison result by the comparator circuit 22 at that time. As a single comparison operation, the successive approximation data SAD of the register is sequentially updated by a technique such as a binary search or the like, and the A/D conversion result data DOUT is determined when this successive approximation operation is completed. The control circuit 23 sets the A/D conversion result data DOUT in the register to output SAD=DOUT to the D/A converter circuit 21.

According to the above configuration, it is possible to realize A/D conversion of the input voltage by successive approximation using the charge redistribution type D/A converter circuit 21. The target of successive approximation is the output voltages VDFP and VDFN of the adder circuit 40, and the output voltages VDFP and VDFN are voltages obtained by feeding back the quantization error by the hold circuits HPi and HNi. As a result, a hybrid type A/D converter circuit incorporating a delta sigma type configuration is realized with a differential configuration.

2. Layout Configuration Example

Figure 2:
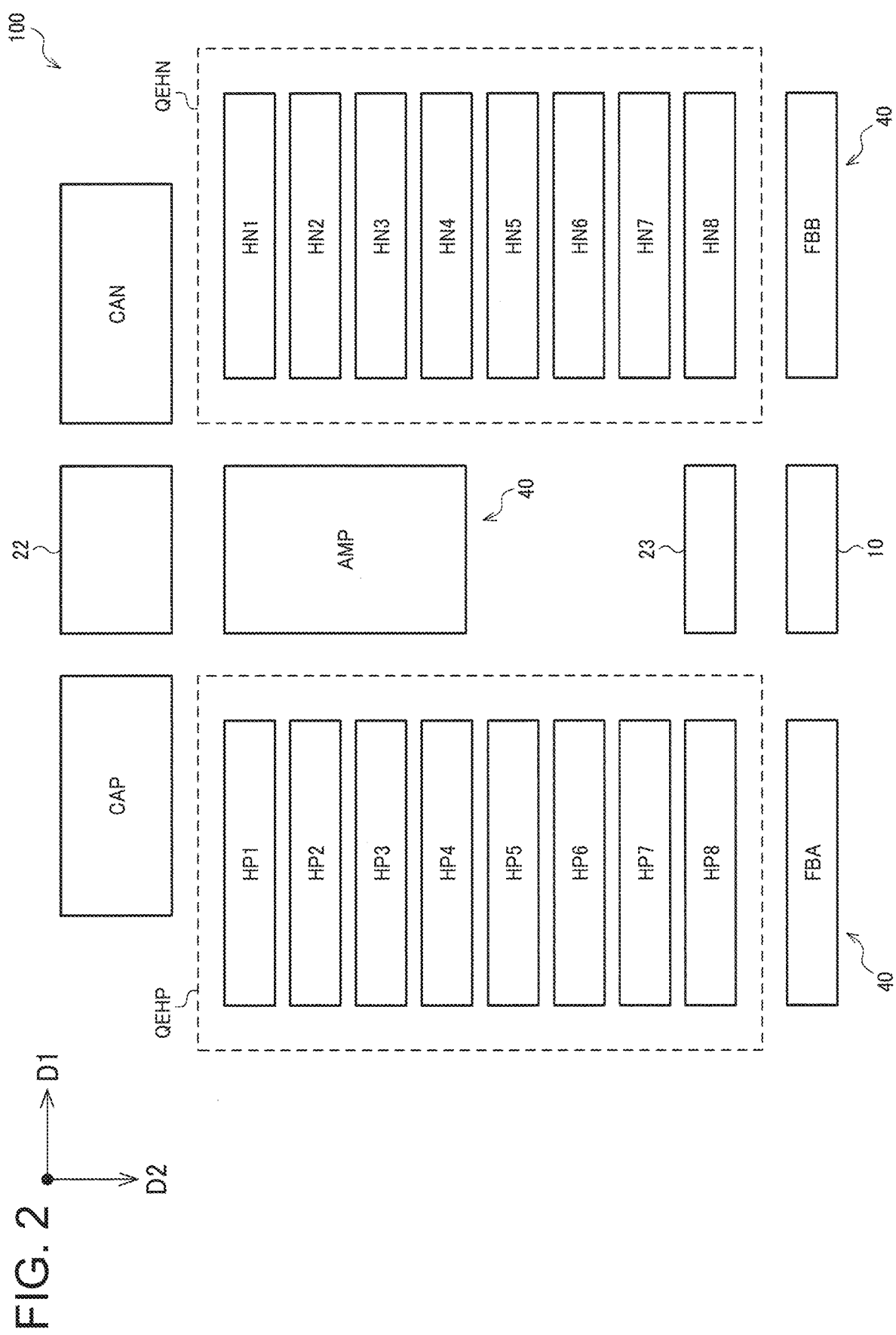
FIG. 2 is a first layout configuration example of the circuit device.

FIG. 2 shows an example of a first layout configuration of the circuit device 100. In FIG. 2, solid square boxes indicate placement regions of respective circuits.

The placement region is the region where the constituent elements of the circuit are placed. That is, the placement region is the region where circuit elements constructing a circuit, wiring connecting between the elements, a guard bar (a structure protecting the circuit from noise or the like by connecting a diffusion region provided around the circuit to a power supply or the like), and the like are placed. The circuit elements are, for example, a transistor, a resistor, a capacitor or the like, and the polysilicon, diffusion layer and metal layer constituting the elements are placed in the region.

Placement is to place the layout of circuits formed on a substrate in plan view with respect to a substrate (semiconductor chip) of the circuit device 100 (integrated circuit device).

As shown in FIG. 2, the capacitor array circuit CAP and the capacitor array circuit CAN are placed along a direction D1 (first direction). A direction orthogonal to the direction D1 is defined as D2 (second direction). At this time, the quantization error hold circuit QEHP is placed on the direction D2 side (the second direction side) of the capacitor array circuit CAP. The quantization error hold circuit QEHN is placed on the direction D2 side of the capacitor array circuit CAN.

Specifically, one side along the direction D1 of the placement region of the capacitor array circuit CAP and one side along the direction D1 of the placement region of the quantization error hold circuit QEHP face each other. That is, the capacitor array circuit CAP and the quantization error hold circuit QEHP are placed adjacent to each other in the direction D2. For example, other circuit elements (excluding wiring) are not placed between the capacitor array circuit CAP and the quantization error hold circuit QEHP. One side along the direction D1 of the placement region of the capacitor array circuit CAN and one side along the direction D1 of the placement region of the quantization error hold circuit QEHN face each other. That is, the capacitor array circuit CAN and the quantization error hold circuit QEHN are placed adjacent to each other in the direction D2. For example, other circuit elements (excluding wiring) are not placed between the capacitor array circuit CAN and the quantization error hold circuit QEHN.

The directions D1 and D2 are directions in plan view with respect to the substrate of the circuit device 100. For example, the direction D1 is the direction along the first side of the substrate of the circuit device 100, and the direction D2 is the direction along the second side (the side orthogonal to the first side) of the substrate.

According to the above embodiment, it is possible to efficiently place the layout of the hybrid type A/D converter circuit of differential configuration from the viewpoint of circuit area and signal transmission. Specifically, it is possible to place the circuits (CAP and QEHP) on the positive electrode side and the circuits (CAN and QEHN) on the negative electrode side of the differential configuration symmetrically by placing the capacitor array circuits CAP and CAN along the direction D1 and placing the quantization error hold circuits QEHP and QEHN on the respective direction D2 sides. That is, it is possible to place the circuits in line symmetry with respect to the axis of symmetry along the direction D2. In addition, one ends of the quantization error hold circuits QEHP and QEHN are connected to the sampling nodes NSP and NSN of the capacitor array circuits CAP and CAN as described with reference to FIG. 1. The quantization error hold circuits QEHP and QEHN are placed on the direction D2 side of the capacitor array circuits CAP and CAN, whereby one ends of the quantization error hold circuits QEHP and QEHN and the sampling nodes NSP and NSN of the capacitor array circuits CAP and CAN may be connected with a short wiring length. For example, one end of the quantization error hold circuit QEHP and the capacitor array circuit CAP may be connected to the wiring of the NSP by wiring the sampling nodes NSP and NSN along the direction D2 and connecting one end of the quantization error hold circuit QEHN and the capacitor array circuit CAN to the wiring of the NSN.

In addition, the quantization error hold circuits QEHP and QEHN hold charges by performing charge redistribution between the capacitors of the capacitor array circuits CAP and CAN and the capacitors of the quantization error hold circuits QEHP and QEHN. At this time, for example, the areas (total capacitance value) of the capacitor array circuits CAP and CAN and the areas (capacitance value) of the hold circuits of the quantization error hold circuits QEHP and QEHN may be of the same scale. In this case, it is possible to effectively place the layout from the viewpoint of the circuit area by placing the quantization error hold circuits QEHP and QEHN on the direction D2 side of the capacitor array circuits CAP and CAN.

In addition, in the present embodiment, the comparator circuit 22 is placed between the capacitor array circuit CAP and the capacitor array circuit CAN.

Specifically, one side along the direction D2 of the placement region of the capacitor array circuit CAP and one side along the direction D2 of the comparator circuit 22 face each other. One side along the direction D2 of the placement region of the capacitor array circuit CAN and one side (a side different from the one side) along the direction D2 of the comparator circuit 22 face each other. That is, the comparator circuit 22 is placed adjacent to the direction D2 side of the capacitor array circuit CAP, and the capacitor array circuit CAN is placed adjacent to the direction D2 side of the comparator circuit 22. For example, other circuit elements (excluding wiring) are not placed between the capacitor array circuits CAP and CAN and the comparator circuit 22.

As described in FIG. 1, the sampling node NSP of the capacitor array circuit CAP is connected to the non-inverting input node of the comparator circuit 22, and the sampling node NSN of the capacitor array circuit CAN is connected to the inverting input node of the comparator circuit 22. Since the capacitor array circuits CAP and CAN perform D/A conversion by charge redistribution, it is desirable that the propagation of noise to the sampling nodes NSP and NSN via capacitive coupling is as small as possible. According to the present embodiment, the comparator circuit 22 is placed between the capacitor array circuits CAP and CAN, whereby it is possible to wire the sampling nodes NSP and NSN with a short wiring length. As a result, it is possible to reduce the parasitic capacitance to the sampling nodes NSP and NSN and to reduce the propagation of noise through the capacitive coupling of the parasitic capacitance.

In addition, according to the present embodiment, since the sampling nodes NSP and NSN are wired between the capacitor array circuits CAP and CAN and the comparator circuit 22, one ends of the quantization error hold circuits QEHP and QEHN provided on the direction D2 side of the capacitor array circuits CAP and CAN may be connected to the sampling nodes NSP and NSN with a short wiring length.

In addition, in the present embodiment, the adder circuit 40 includes an operational amplifier AMP placed between the quantization error hold circuit QEHP and the quantization error hold circuit QEHN.

As will be described later with reference to FIG. 8, the adder circuit 40 includes the operational amplifier AMP, capacitors CFP, CFN, CIP, and CIN, switches SFP, SFN, SDP, SDN, SEP, and SEN. Thereamong, the operational amplifier AMP is placed between the quantization error hold circuits QEHP and QEHN. In addition, the capacitors CFP and CIP, and the switches SFP, SDP, and SEP are placed on the direction D2 side of the quantization error hold circuit QEHP as a circuit FBA on the positive electrode side. In addition, the capacitors CFN and CIN, and the switches SFN, SDN, and SEN are placed on the direction D2 side of the quantization error hold circuit QEHN as a circuit FBB on the negative electrode side.

Figure 8:
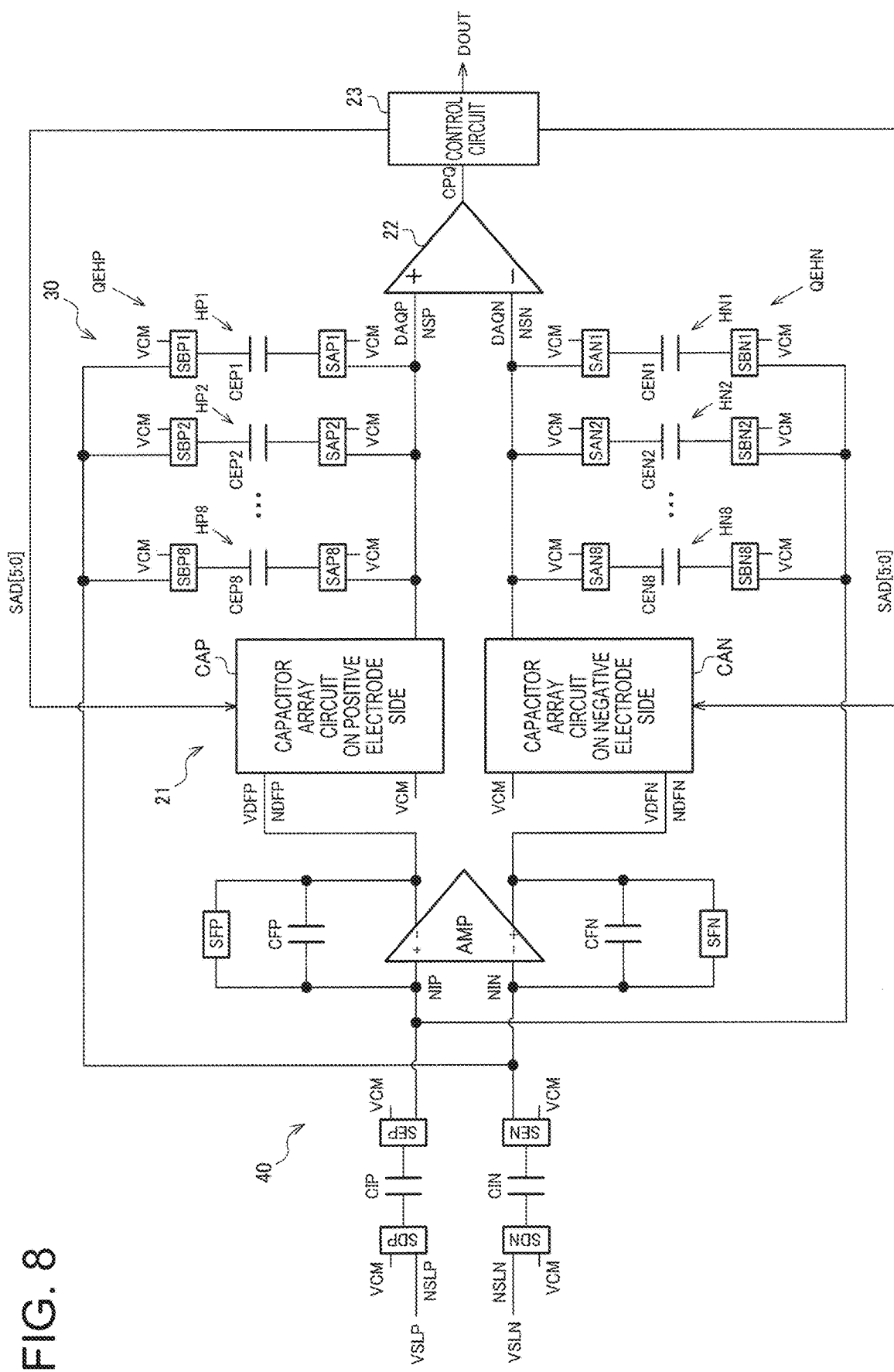
FIG. 8 is a second detailed configuration example of the circuit device.

As shown in FIG. 8, the inverting input node NIN of the operational amplifier AMP is connected to the other end of the quantization error hold circuit QEHP, and a non-inverting input node NIP of the operational amplifier AMP is connected to the other end of the quantization error hold circuit QEHN. According to the present embodiment, the operational amplifier AMP is placed between the quantization error hold circuits QEHP and QEHN, whereby it is possible to wire between the inverting input node NIN and the other end of the quantization error hold circuit QEHP and between the non-inverting input node NIP and the other end of the quantization error hold circuit QEHN with a short wiring length.

In addition, according to the present embodiment, the operational amplifier AMP is placed on the direction D2 side of the comparator circuit 22, and the capacitor array circuits CAP and CAN are placed with the comparator circuit 22 interposed therebetween, and the quantization error hold circuits QEHP and QEHN are placed with the operational amplifier AMP interposed therebetween. As a result, the hybrid type A/D converter circuit of differential configuration may be placed symmetrically (line symmetric as described above), and it is possible to efficiently place the layout from the viewpoint of signal transmission.

Further, the control circuit 23 may be placed between the quantization error hold circuit QEHP and the quantization error hold circuit QEHN (on the side of the direction D2 of the operational amplifier AMP). In addition, the selector 10 may be further placed between the circuit FBA on the positive electrode side and the circuit FBB on the negative electrode side of the adder circuit 40 or between the quantization error hold circuit QEHP and the quantization error hold circuit QEHN (the direction D2 side of the control circuit 23).

In addition, in the present embodiment, the hold circuits HP1 to HPn of the quantization error hold circuit QEHP are placed along the direction D2, and the hold circuits HN1 to HNn of the quantization error hold circuit QEHN are placed along the direction D2.

That is, the hold circuits HP1 to HPn are placed along the direction D2 in the placement region of the quantization error hold circuit QEHP placed on the direction D2 side of the capacitor array circuit CAP. For example, the hold circuits HP1 and HP2 are placed adjacent to each other, and the hold circuits HP2 to HPn are similarly placed next to each other in order. The hold circuits HN1 to HNn are placed along the direction D2 in the placement region of the quantization error hold circuit QEHN placed on the direction D2 side of the capacitor array circuit CAN. For example, the hold circuits HN1 and HN2 are placed adjacent to each other, and the hold circuits HN2 to HNn are similarly placed next to each other in order. For example, the long sides of the hold circuits HP1 to HPn and HN1 to HNn are sides along the direction D1, and the short sides are sides along the direction D2.

When the number of input channels to the A/D converter circuit is changed, the number (value n) of the hold circuits HP1 to HPn and HN1 to HNn changes accordingly. According to the present embodiment, even when the number of hold circuits HP1 to HPn and HN1 to HNn is changed, it is possible to efficiently change the layout by using the existing circuit design. That is, since the hold circuits HP1 to HPn and HN1 to HNn are placed along the direction D2, it is possible to change the layout by shortening or extending the layout size (the length in the direction D2 of the layout region) in the direction D2 with the change in the number.

Figure 3:
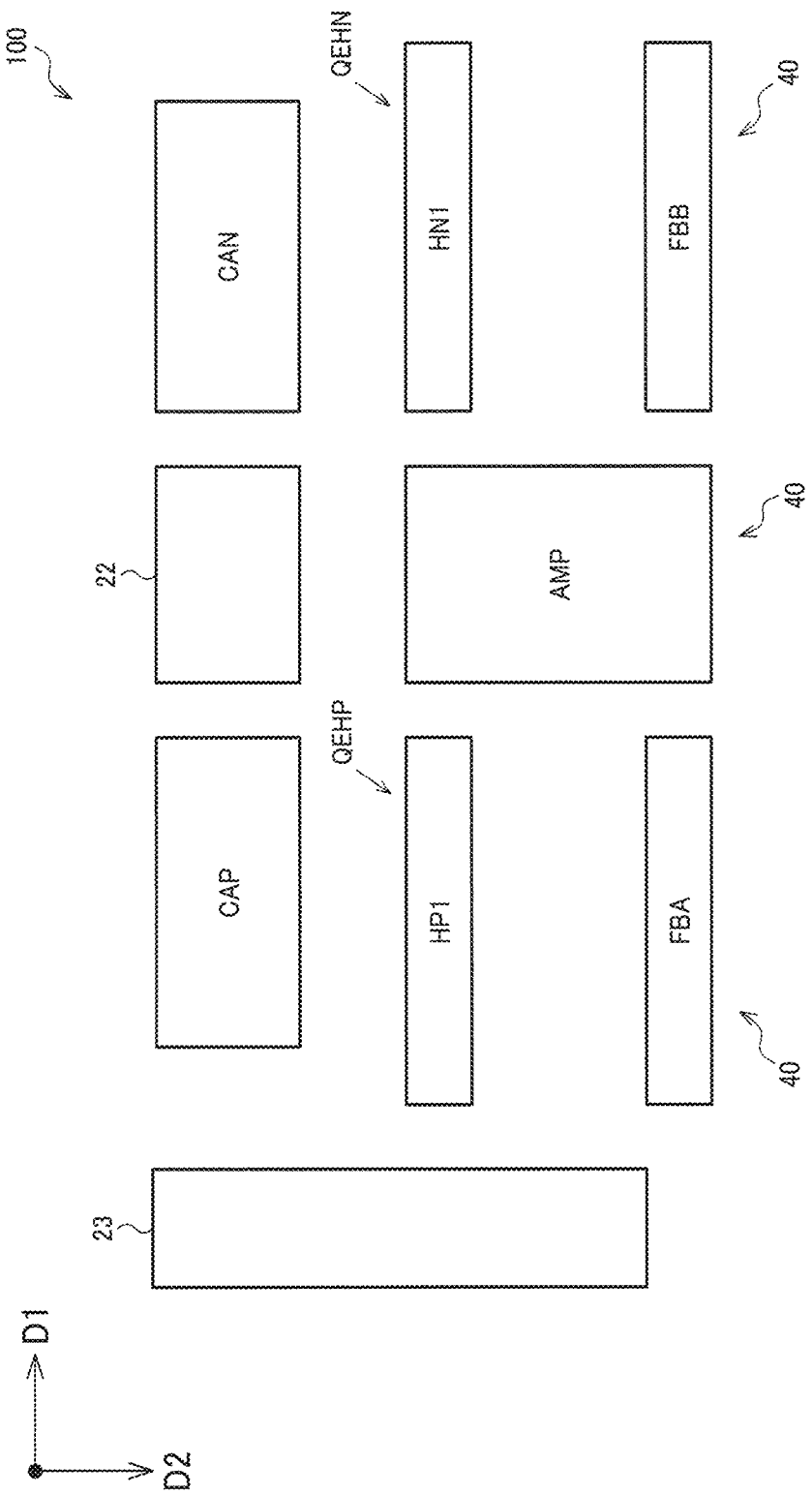
FIG. 3 is a second layout configuration example of the circuit device.

FIG. 3 shows an example of a second layout configuration of the circuit device 100. FIG. 3 shows a layout configuration example in a case where the number of input channels is 1 (n=1). In FIG. 3, the placements of the capacitor array circuits CAP and CAN, the comparator circuit 22, and the operational amplifier AMP are the same as those in FIG. 2. On the other hand, only the hold circuits HP1 and HN1 are placed as the quantization error hold circuits QEHP and QEHN on the direction D2 side of the capacitor array circuits CAP and CAN. The positive electrode side circuit FBA and the negative electrode side circuit FBB of the adder circuit 40 are moved in the direction opposite to the direction D2, and the size of the circuit device 100 as a whole in the direction D2 is reduced. The control circuit 23 is placed, for example, on the side opposite to the direction D1 of the capacitor array circuit CAP or the hold circuit HP1.

In this manner, in a case where the number of hold circuits HP1 to HPn and HN1 to HNn is changed, it is possible to adjust the layout size in the direction D2 without changing the placement of the other circuits (the capacitor array circuits CAP and CAN, the comparator circuit 22, the operational amplifier AMP, and the like). As a result, it is possible to efficiently change the layout by using the existing circuit design.

3. Second Circuit Configuration Example

Figure 4:
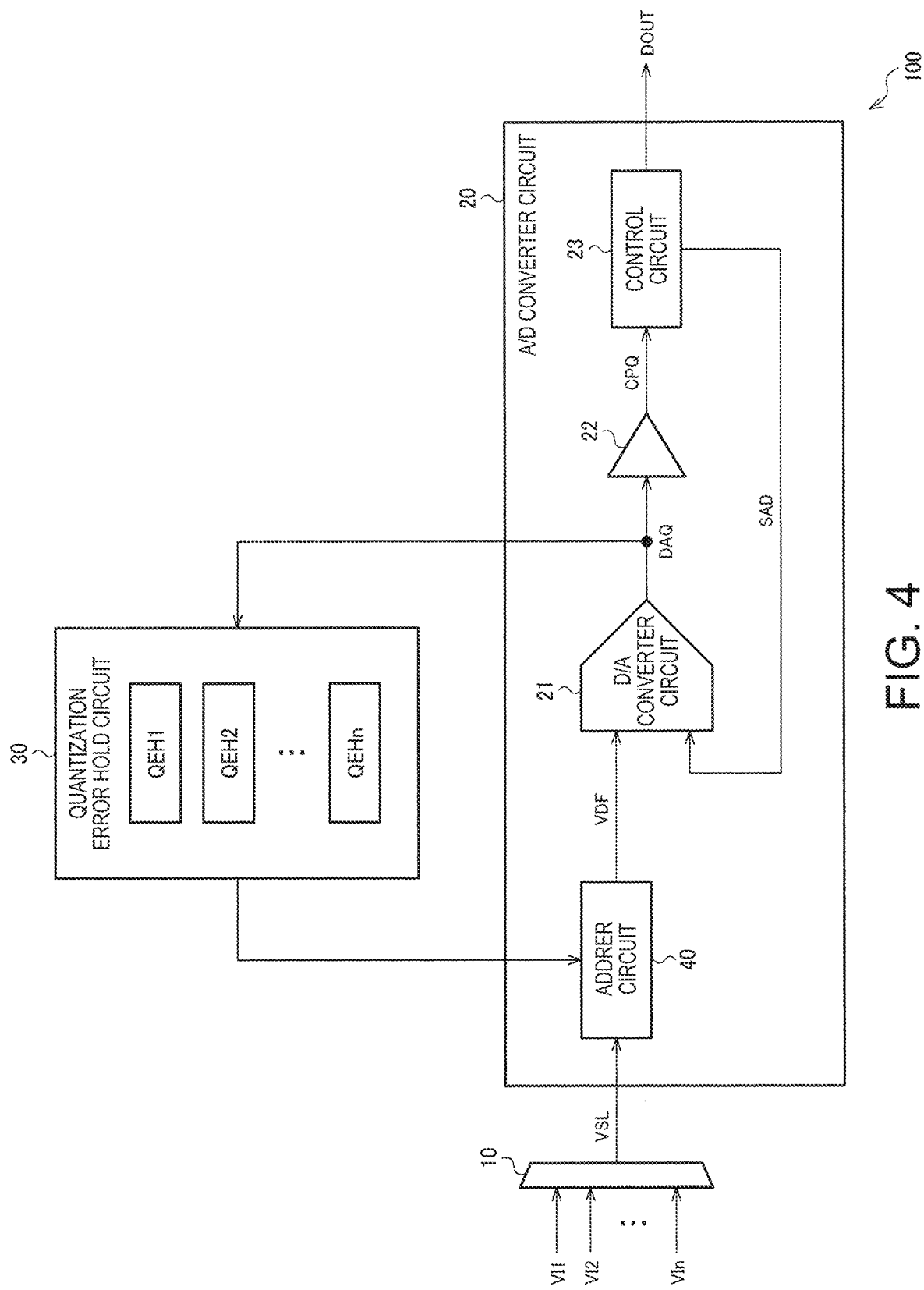
FIG. 4 is a second circuit configuration example of the circuit device.

The detailed operation of the circuit device 100 will be described with reference to FIGS. 4 and 5. FIG. 4 shows an example of a second circuit configuration of the circuit device 100. Here, the basic configuration of the circuit device 100 is shown, and the operation will be described using the basic configuration.

As shown in FIG. 4, the circuit device 100 includes the selector 10, an A/D converter circuit 20, and a quantization error hold circuit 30.

The selector 10 sequentially selects the voltages VI1 to VIn in a time division manner and outputs the voltage selected for the time division as an output voltage VSL. VSL corresponds to VSLP and VSLN in FIG. 1.

The adder circuit 40 amplifies and adds the voltage corresponding to the charge held in the quantization error hold circuit QEHi and the input voltage (VSL) with gains of opposite signs to output the result as the output voltage VDF. VDF corresponds to VDFP and VDFN in FIG. 1.

The D/A converter circuit 21 outputs the difference between the output voltage VDF of the adder circuit 40 and the D/A converted voltage of the successive approximation data SAD as a D/A conversion result (differential voltage DAQ). DAQ corresponds to DAQP and DAQN in FIG. 1.

The quantization error hold circuit 30 includes quantization error hold circuits QEH1 to QEHn that hold charges corresponding to a quantization error in A/D conversion of the voltages VI1 to VIn. The quantization error hold circuit QEHi holds (the attenuated voltage of) the differential voltage DAQ after the successive approximation operation ends in the A/D conversion when the selector 10 selects the voltage VIi. QEHi corresponds to HPi and HNi in FIG. 1.

The comparator circuit 22 makes a comparison determination between the output voltage VDF of the adder circuit 40 and the D/A converted voltage of the successive approximation data SAD based on the differential voltage DAQ from the D/A converter circuit 21.

The control circuit 23 performs the successive approximation operation of sequentially updating the successive approximation data SAD output to the D/A converter circuit 21 based on the comparison result (CPQ) by the comparator circuit 22.

Figure 5:
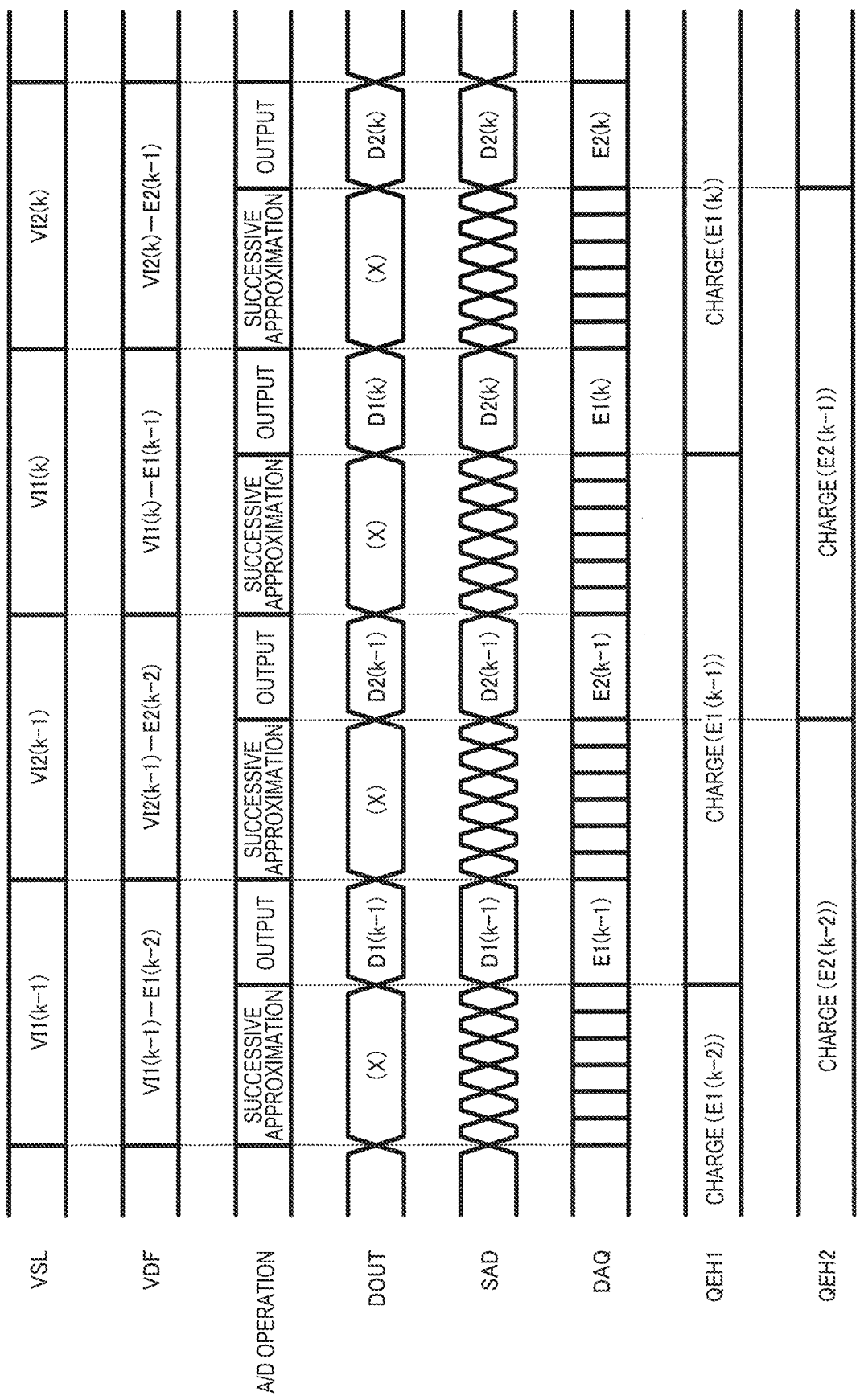
FIG. 5 is a timing chart for describing a basic operation of the circuit device of the second circuit configuration example.

FIG. 5 is a timing chart for describing the basic operation of the circuit device 100 in FIG. 4. Hereinafter, the case where n=2 will be described, but is not limited to n=2. In addition to the operation of FIG. 5, a reset operation and a sampling operation of the adder circuit 40, a reset operation and a sampling operation of the quantization error hold circuits QEH1 and QEH2, and the like may be further included.

In a first period of the (k−1)th A/D conversion, the selector 10 selects the voltage VI1 as the voltage VSL, and the adder circuit 40 samples and holds the voltage VSL=VI1.

It is assumed that this held voltage is VI1 (k−1). The quantization error hold circuit QEH1 holds a charge corresponding to the output voltage (E1($k$−2)) of the D/A converter circuit 21 after the successive approximation operation is completed in (k−2)th A/D conversion. The adder circuit 40 outputs VDF=VI(k−1)−E1($k$−2) based on the charge. Here, the gain of the adder circuit 40 with respect to the voltage VSL is 1, but the gain is not limited to 1. The D/A converter circuit 21, the comparator circuit 22, and the control circuit 23 perform the successive approximation operation to perform A/D conversion on the output voltage VDF of the adder circuit 40 and output A/D conversion result data DOUT=D1($k$−1). (X) of DOUT indicates do not care. The control circuit 23 outputs SAD=D1($k$−1), the D/A converter circuit 21 outputs a voltage E1($k$−1) corresponding to the quantization error, and the quantization error hold circuit QEH1 holds the charge corresponding to the voltage E1($k$−1).

Next, in a second period of the (k−1)th A/D conversion, the selector 10 selects the voltage VI2 as the voltage VSL, and the adder circuit 40 samples and holds the voltage VSL=VI2. It is assumed that this held voltage is VI2(k−1). By the same operation as above, the D/A converter circuit 21 outputs a voltage E2(k−1) corresponding to the quantization error, and the quantization error hold circuit QEH2 holds the charge corresponding to the voltage E2(k−1).

Next, in a first period of the k-th A/D conversion, the selector 10 selects the voltage VI1 as the voltage VSL, and the adder circuit 40 samples and holds the voltage VSL=VI1. It is assumed that this held voltage is VI1(k). By the same operation as above, the D/A converter circuit 21 outputs a voltage E1(k) corresponding to the quantization error, and the quantization error hold circuit QEH1 holds the charge corresponding to the voltage E1(k).

Next, in a second period of the k-th A/D conversion, the selector 10 selects the voltage VI2 as the voltage VSL, and the adder circuit 40 samples and holds the voltage VSL=VI2. It is assumed that this held voltage is VI2(k). By the same operation as above, the D/A converter circuit 21 outputs a voltage E2(k) corresponding to the quantization error, and the quantization error hold circuit QEH2 holds the charge corresponding to the voltage E2(k). Hereinafter, the same operation is repeated for the (k+1)th and subsequent A/D conversion.

The transfer function realized by the above operation is shown in the following equation (1). V(Di) represents the A/D conversion result data DOUT=Di of the voltage VIi by voltage, specifically, the D/A converted voltage of Di. In the following equation (1), the effect of a primary high-pass filter (1-z-1) is achieved with respect to a voltage Ei which is the quantization error. That is, in the A/D conversion result data DOUT=Di, the primary noise shaping effect is achieved with respect to the noise due to the quantization error.

$$V(Di) = VIi + (1-z^{-1}) \times Ei \quad (1)$$

Figure 6:
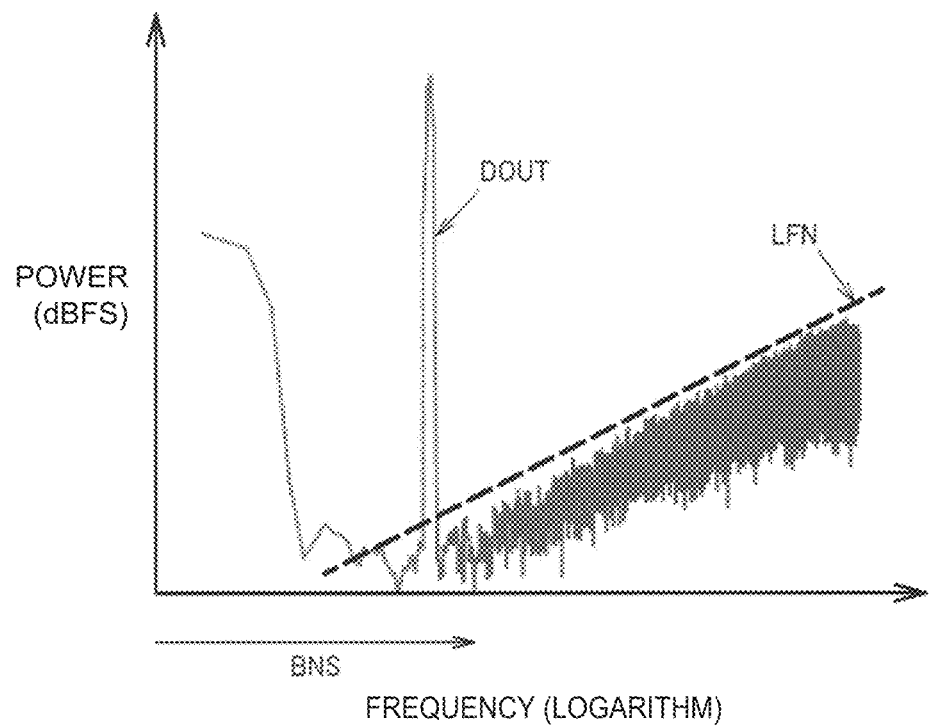
FIG. 6 is an example of frequency characteristics of A/D conversion result data in the present embodiment.

FIG. 6 shows an example of the frequency characteristics of the A/D conversion result data DOUT in the present embodiment. In the example of FIG. 6, a signal of a predetermined frequency is input as an input signal, which is shown as a peak of the frequency characteristics. The input signal is not limited to the signal of the predetermined frequency, but a signal including the frequency component of a signal band BNS may be assumed. When the signal band BNS is lower than the conversion rate of the A/D conversion, the signal band BNS is over-sampled at a high conversion rate. For example, the conversion rate is 5 times or more, or 10 times or more the upper limit frequency of the signal band BNS. Since the floor noise (quantization noise) in a low frequency band is reduced by the noise shaping effect as indicated by the straight line FLN, it is possible to improve S/N by lowering the noise of higher frequency than the signal band BNS with a low-pass filter. As a result, it is possible to achieve high accuracy (for example, enlarging the number of effective bits) of the A/D conversion result data.

4. First Detailed Configuration Example

Figure 7:
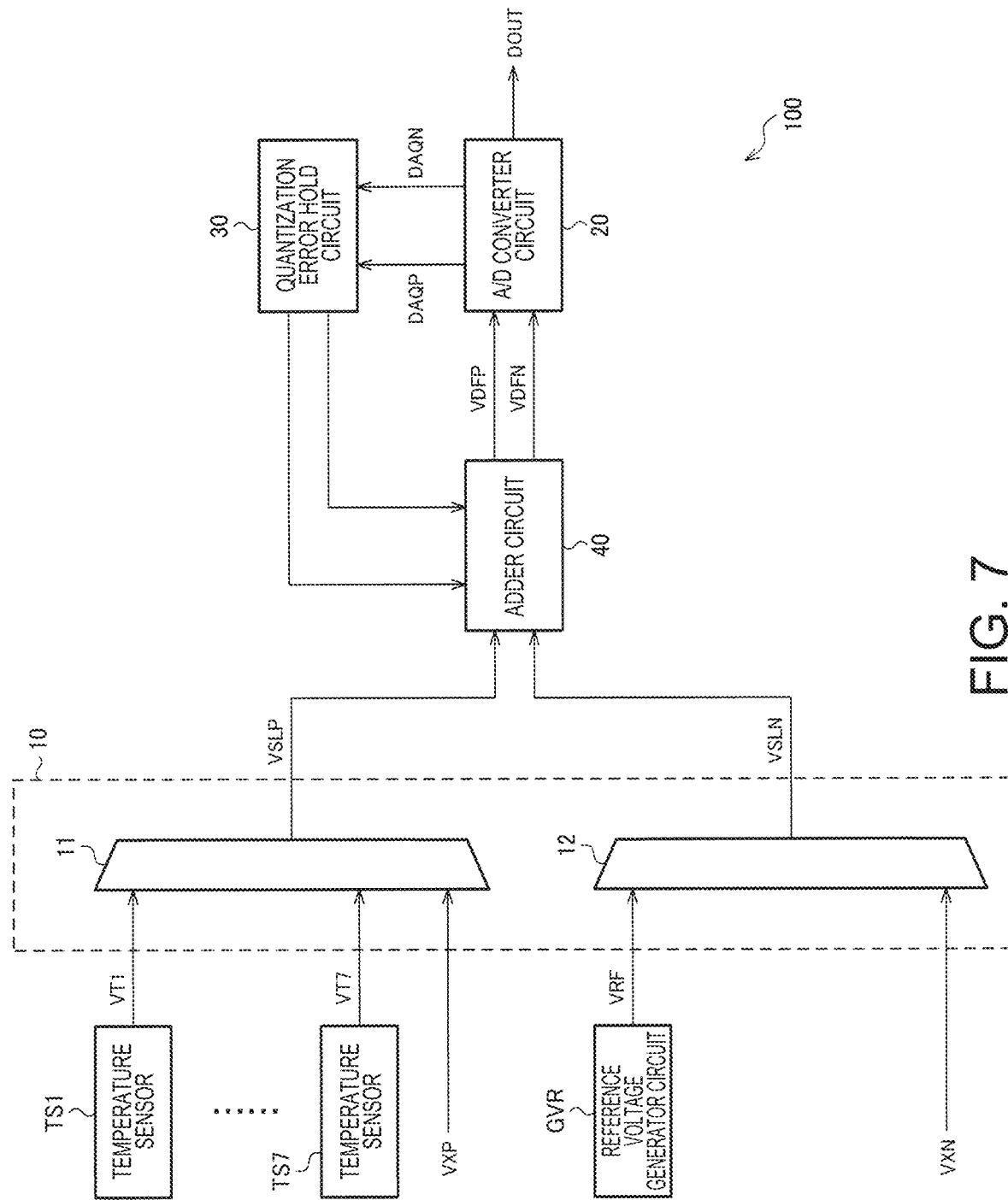
FIG. 7 is a first detailed configuration example of the circuit device.

FIG. 7 shows a first detailed configuration example of the circuit device 100. The circuit device 100 of FIG. 7 includes the selector 10, an A/D converter circuit 20, a quantization error hold circuit 30, and an adder circuit 40. In addition, the circuit device 100 may include a reference voltage generator circuit GVR. In the following, the case of n=8 will be described, but is not limited to n=8.

The temperature sensors TS1 to TS7 are sensors for measuring the temperature of a temperature measurement target. As the temperature sensors TS1 to TS7, for example, a temperature sensor utilizing the temperature dependency of the bandgap voltage of the PN junction or a thermistor utilizing the temperature dependency of the resistance value of the resistance or the like may be used. A part of the temperature sensors TS1 to TS7 is built in the circuit device 100, and the rest are provided outside the circuit device 100 (for example, inside the oscillation device and the like including the circuit device 100). Alternatively, all of the temperature sensors TS1 to TS7 may be built in the circuit device 100, or all of the temperature sensors TS1 to TS7 may be provided outside the circuit device 100.

The selector 10 includes a selector 11 (selector on positive electrode side and a first selector) and a selector 12 (selector on negative electrode side and a second selector).

Temperature detection voltages VT1 to VT7 (first to seventh voltages on positive electrode side) from temperature sensors TS1 to TS7 are input to the selector 11. In addition, an arbitrary voltage VXP (an eighth voltage on positive electrode side) used for a test or the like, may be input to the selector 11, for example. A reference voltage VRF (a first voltage on negative electrode side) from the reference voltage generator circuit GVR is input to the selector 12. In addition, an arbitrary voltage VXN (a second voltage on negative electrode side) used for a test or the like, may be input to the selector 12, for example. For example, the reference voltage generator circuit GVR is a band gap reference circuit, and the reference voltage VRF is a band gap reference voltage (a voltage with no temperature dependency).

The selector 11 sequentially selects the temperature detection voltages VT1 to VT7 and the arbitrary voltage VXP to output the voltage as the time-division output voltage VSLP. When the selector 11 is outputting the temperature detection voltages VT1 to VT7, the selector 12 selects the reference voltage VRF to output the voltage as the output voltage VSLN. In addition, when selecting the arbitrary voltage VXP, the selector 11 selects the arbitrary voltage VXN to output the voltage as the output voltage VSLN.

In this configuration example, the differential voltage signal constructed of (VT1 and VRF) corresponds to the voltage VI1 in FIGS. 1 and 4. Similarly, the differential voltage signals constructed of (VT2 and VRF), (VT3 and VRF), (VT4 and VRF), (VT5 and VRF), (VT6 and VRF), (VT7 and VRF), and (VXP and VXN) correspond to the voltages VI2, VI3, VI4, VI5, VI6, VI7, and VI8 in FIGS. 1 and 4.

The adder circuit 40 differentially amplifies the differential voltage signals (VSLP and VSLN) from the selector 10 and performs charge voltage conversion (differential QV conversion) on the charge on the positive electrode side and the charge on the negative electrode side from the quantization error hold circuit 30 to output differential voltage signals (VDFP and VDFN) obtained by adding the differential voltage signals.

The A/D converter circuit 20 is a differential input A/D converter circuit 20. That is, the A/D converter circuit 20 performs A/D conversion on the differential voltage signals constructed of the output voltages VDFP and VDFN of the adder circuit 40 to output the A/D conversion result data DOUT corresponding to the difference between the output voltages VDFP and VDFN.

The quantization error hold circuit 30 holds differential voltage signals (DAQP and DAQN) which are output signals of the D/A converter circuit 21 after the successive approximation operation of the A/D converter circuit 20 is completed. Specifically, the quantization error hold circuit 30 holds the charge corresponding to the voltage DAQP constructing the differential voltage signal and the charge corresponding to the voltage DAQN.

According to the present embodiment, the temperature detection voltages VT1 to VT7 from the temperature sensors TS1 to TS7 are input to the selector 10 as the voltages VI1 to VI7 of the voltages VI1 to VI8. The number of temperature sensors is not limited to 7. That is, first to m-th temperature detection voltages from first to m-th temperature sensors (m is an integer from 1 to n) may be input to the selector 10 as first to m-th voltages of the first to n-th voltages.

Since the change in temperature is gentle, the signal band of the temperature detection voltages VT1 to VT7 output from the temperature sensors TS1 to TS7 is in a low frequency band (for example, 100 Hz or less). Therefore, even with a comparatively low speed A/D converter circuit such as the successive approximation type, it is possible to perform A/D conversion with a sufficiently higher conversion rate than the signal band. In the present embodiment, it is possible to realize an oversampling state accompanied by the noise shaping effect as described above and to measure high S/N in the signal band of the temperature sensor by constructing a hybrid type A/D converter circuit.

Temperature compensation processing in a digital oscillator such as a temperature compensated crystal oscillator (TCXO) or an oven controlled crystal oscillator (OCXO) may be considered as processing using temperature detection data (A/D conversion result data of temperature detection voltage). There is a possibility that the temperature of the vibrator (for example, a quartz vibrator or the like) is estimated with high accuracy by using a plurality of temperature sensors provided at a plurality of positions inside (or internal and external) the oscillator. Since the temperature of the vibrator may be estimated with high accuracy, it is possible to improve the accuracy of temperature compensation and the stability of the oscillation frequency. In the present embodiment, since it is possible to construct a hybrid A/D converter circuit coping with multichannel input, it is possible to perform A/D conversion with high accuracy for the multichannel input from the plurality of temperature sensors.

5. Second Detailed Configuration Example

Figure 9:
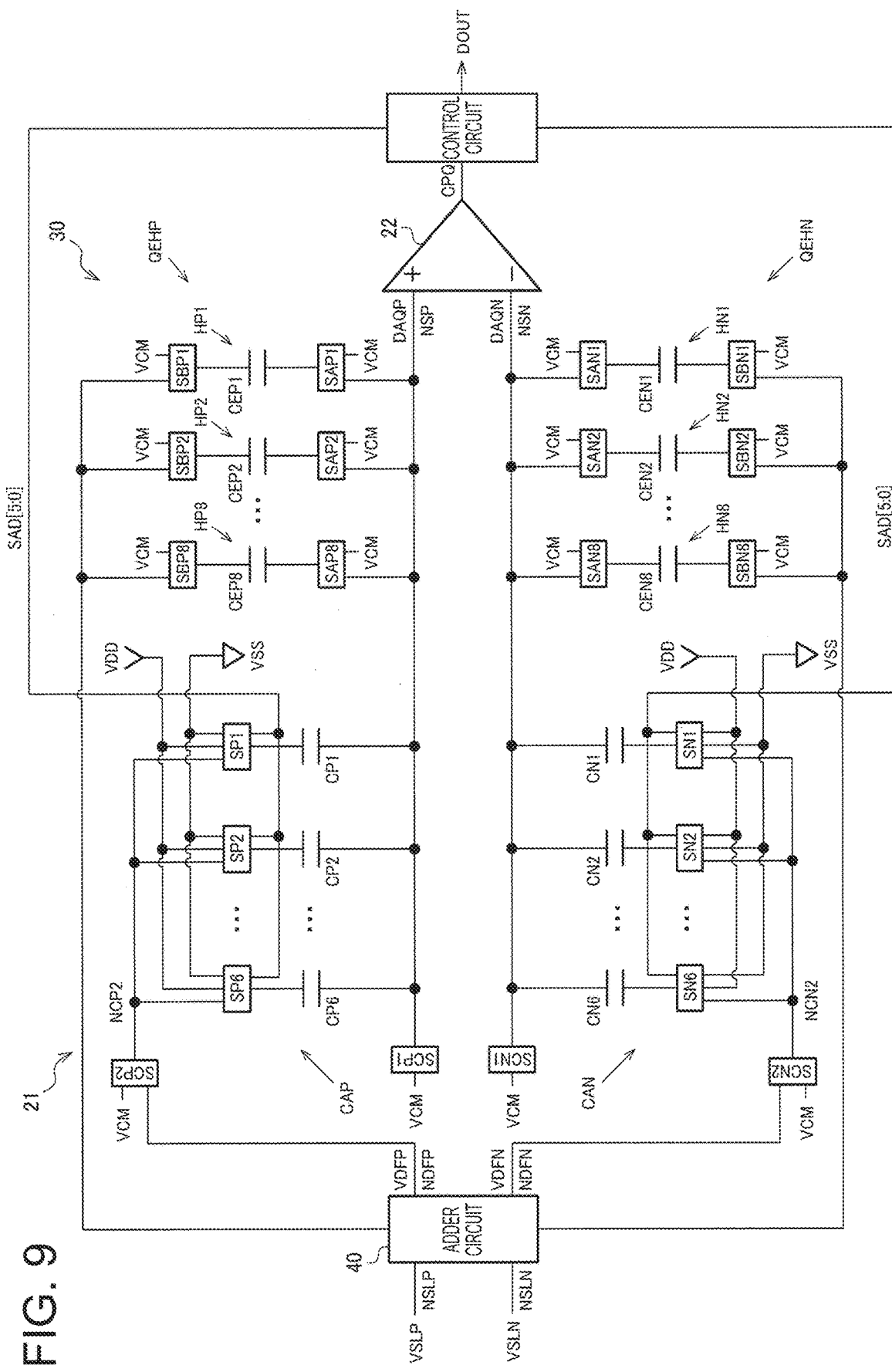
FIG. 9 is a second detailed configuration example of the circuit device.

FIGS. 8 and 9 show a second detailed configuration example of the circuit device 100. A second detailed configuration example is shown separately in FIGS. 8 and 9, and the same constituent elements are denoted by the same reference numerals. The case where n=8 will be described below, but is not limited to n=8.

As shown in FIG. 8, the adder circuit 40 includes the capacitor CIP (input capacitor on positive electrode side), the capacitor CIN (input capacitor on negative electrode side), the capacitor CFP (feedback capacitor on positive electrode side), the capacitor CFN (feedback capacitor on negative electrode side), the switches SDP, SDN, SEP, SEN, SFP, and SFN, and a fully differential operational amplifier AMP. The fully differential operational amplifier is an operational amplifier of a differential input and a differential output.

The switch SDP connects one end of the capacitor CIP to one of the output node NSLP (a first output node of the selector 10) and the node of the common voltage VCM of the selector 11. The switch SDN connects one end of the capacitor CIN to one of the output node NSLN (a second output node of the selector 10) and the node of the common voltage VCM of the selector 12. The switch SEP connects the other end of the capacitor CIP to one of the non-inverting input node NIP of the operational amplifier AMP and the node of the common voltage VCM. The switch SEN connects the other end of the capacitor CIN to one of the inverting input node NIN of the operational amplifier AMP and the node of the common voltage VCM. One end of the capacitor CFP and one end of the switch SFP are connected to the non-inverting input node NIP of the operational amplifier AMP, and the other end of the capacitor CFP and the other end of the switch SFP are connected to an inverting output node NDFP of the operational amplifier AMP. One end of the capacitor CFN and one end of the switch SFN are connected to the inverting input node NIN of the operational amplifier AMP, and the other end of the capacitor CFN and the other end of the switch SFN are connected to the non-inverting output node NDFN of the operational amplifier AMP. The switches SDP, SDN, SEP, SEN, SFP, and SFN are, for example, analog switches constructed of transistors.

As shown in FIGS. 8 and 9, the D/A converter circuit 21 is a differential D/A converter circuit. The D/A converter circuit 21 includes a capacitor array circuit CAP (capacitor array circuit on positive electrode side) and a capacitor array circuit CAN (capacitor array circuit on negative electrode side).

As shown in FIG. 9, the capacitor array circuit CAP includes capacitors CP1 to CP6 and switches SP1 to SP6, SCP1, and SCP2. One end of the switch SCP1 is connected to the sampling node NSP of the capacitor array circuit CAP and the other end is connected to the node of the common voltage VCM. One end of the capacitor CPj (j is an integer from 1 to 6) is connected to the sampling node NSP. The switch SPj connects the other end of the capacitor CPj to any one of a node NCP2, the node of a voltage VDD (power supply voltage, a first voltage), and the node of a voltage VSS (ground voltage, a second voltage). The switch SCP2 connects the node NCP2 to one of the inverting output node NDFP of the operational amplifier AMP and the node of the common voltage VCM. The capacitance value of the capacitor CPj is $CP1 \times 2^{j-1}$. The switches SP1 to SP6, SCP1 and SCP2 are, for example, analog switches consisting of transistors.

The capacitor array circuit CAN includes capacitors CN1 to CN6 and switches SN1 to SN6, SCN1, and SCN2. One end of the switch SCN1 is connected to the sampling node NSN of the capacitor array circuit CAN and the other end is connected to the node of the common voltage VCM. One end of a capacitor CNj is connected to the sampling node NSN. A switch SNj connects the other end of the capacitor CNj to any one of a node NCN2, the node of the voltage VDD, and the node of the voltage VSS. The switch SCN2 connects the node NCN2 to one of the node of the non-inverting output node NDFN of the operational amplifier AMP and the node of the common voltage VCM. The capacitance value of the capacitor CNj is $CN1 \times 2^{j-1}$. The switches SN1 to SN6, SCN1 and SCN2 are, for example, analog switches consisting of transistors.

The number of capacitors included in the capacitor array circuits CAP and CAN is not limited to 6, the capacitor array circuit CAP may include first to k-th capacitors on the positive electrode side (k is an integer of 2 or more), and the capacitor array circuit CAN may include first to k-th capacitors on the negative electrode side. In this case, j is an integer of 1 or more and k or less. In addition, successive approximation data is k-bit data SAD[k−1:0].

As shown in FIGS. 8 and 9, the quantization error hold circuit 30 includes the quantization error hold circuit QEHP (quantization error hold circuit on positive electrode side) and the quantization error hold circuit QEHN (quantization error hold circuit on negative electrode side).

As shown in FIG. 8, the quantization error hold circuit QEHP includes hold circuits HP1 to HP8 (first to n-th positive electrode side hold circuits). The hold circuit HPi (the i-th hold circuit on positive electrode side) includes a capacitor CEPi (hold capacitor on positive electrode side), a switch SAPi (a first switch on positive electrode side), and a switch SBPi (a second switch on positive electrode side). The switch SAPi connects one end of the capacitor CEPi to one of the sampling node NSP and the node of the common voltage VCM or sets the one end of the capacitor CEPi to a floating state. The switch SBPi connects the other end of the capacitor CEPi to one of the inverting input node NIN of the operational amplifier AMP and the node of the common voltage VCM. The capacitance values of the capacitors CEP1 to DEP8 are the same. The switches SAP1 to SAP8 and SBP1 to SBP8 are, for example, analog switches consisting of transistors.

The quantization error hold circuit QEHN includes hold circuits HN1 to HN8 (first to n-th hold circuits on negative electrode side). The hold circuit HNi (the i-th hold circuit on negative electrode side) includes a capacitor CENi (hold capacitor on negative electrode side), a switch SANi (a first switch on the negative electrode side), a switch SBNi (a second switch on the negative electrode side). The switch SANi connects one end of the capacitor CENi to one of the sampling node NSN and the node of the common voltage VCM or sets the one end of the capacitor CENi to a floating state. The switch SBNi connects the other end of the capacitor CENi to one of the non-inverting input node NIP of the operational amplifier AMP and the node of the common voltage VCM. The capacitance values of the capacitors CENT to CEN8 are the same. The switches SAN1 to SAN8 and SBN1 to SBN8 are, for example, analog switches consisting of transistors.

The hold circuits HPi and HNi in FIGS. 8 and 9 correspond to quantization error hold circuit QEHi in FIG. 4.

The comparator circuit 22 is a comparator of a differential input single-ended output. The non-inverting input node of the comparator circuit 22 is connected to the sampling node NSP, and the inverting input node is connected to the sampling node NSN. The voltages DAQP and DAQN which are D/A converted voltages are output to the voltages of the sampling nodes NSP and NSN. When DAQP-DAQN>0 V, the comparator circuit 22 outputs a high-level signal CPQ, and when DAQP-DAQN<0 V, the comparator circuit 22 outputs a low-level signal CPQ. The control circuit 23 updates the successive approximation data SAD[5:0] based on the signal CPQ and outputs the successive approximation data SAD[5:0] to the switches SP1 to SP6 and SN1 to SN6. In addition, the control circuit 23 controls the switches included in the adder circuit 40, the D/A converter circuit 21, and the quantization error hold circuit 30.

The operation of the circuit device 100 in FIGS. 8 and 9 will be described below. Hereinafter, the operation in the k-th A/D conversion when the selector 10 selects the voltage VIi will be described. The state of the switch not mentioned in each period is the same as the state in the previous period.

In the reset period (initialization period), the switches SFP and SFN of the adder circuit 40 are on. As a result, both ends of the capacitors CFP and CFN are connected, and the charges of the capacitors CFP and CFN are reset (initialized). In addition, the switches SCP1 and SCN1 of the capacitor array circuits CAP and CAN are turned on, the switches SCP2 and SCN2 select the node of the common voltage VCM, and the switches SP1 to SP6 and SN1 to SN6 select the nodes NCP2 and NCN2. As a result, both ends of the capacitors CP1 to CP6 and CN1 to CN6 become the common voltage VCM, and the charges of the capacitors CP1 to CP6 and CN1 to CN6 are reset. In addition, the switches SAP1 to SAP8 and SAN1 to SAN8 of the quantization error hold circuits QEHP and QEHN select the floating state, and the switches SBP1 to SBP8 and SBN1 to SBN8 select the node of the common voltage VCM. As a result, the capacitors CEPi and CENi hold charges corresponding to the quantization error in the (k−1)th A/D conversion on the voltage VIi. That is, assuming that DAQP=EPi and DAQN=ENi after the successive approximation operation of the (k−1)th A/D conversion is completed, the capacitors CEPi and CENi hold the voltages EPi and ENi corresponding to the quantization error with reference to the common voltage VCM. However, the voltages at which the voltages EPi and ENi are attenuated are held as described in the following equation (2).

In a first addition operation period after the reset period, the switches SFP and SFN of the adder circuit 40 are off, the switches SBPi and SBNi of the quantization error hold circuits QEHP and QEHN select the input nodes NIN and NIP of the operational amplifier AMP, and the switches SAPi and SANi select the node of the common voltage VCM. As a result, the charge held by the capacitor CEPi is redistributed by the capacitors CEPi and CFN, and the charge held by the capacitor CENi is redistributed by the capacitors CENi and CFP. That is, the differential voltage signal constructed of (the attenuated voltages of) the voltages EPi and ENi corresponding to the quantization error in the (k−1)th A/D conversion is differentially amplified with a negative gain. In addition, in the first addition operation period, the switches SDP and SDN of the adder circuit 40 select the output nodes NSLP and NSLN of the selector 10, and the switches SEP and SEN select the node of the common voltage VCM. As a result, the capacitors CIP and CIN sample the input voltages (VSLP and VSLN) with reference to the common voltage VCM.

In a second addition operation period after the first addition operation period, the switches SDP and SDN select the node of the common voltage VCM, and switches SEP and SEN select the input nodes NIP and NIN of the operational amplifier AMP. As a result, a differential voltage signal constructed of the input voltages (VSLP and VSLN) is differentially amplified with a positive gain. With the above operation, a differential voltage signal constructed of the input voltages (VSLP and VSLN) which is differentially amplified with a positive gain, and a differential voltage signal constructed of (the attenuated voltages of) the voltages EPi and ENi which is differentially amplified with a negative gain are added. The addition result is output as a differential voltage signal consisting of the output voltages VDFP and VDFN. When the second addition operation period ends, the switches SDP and SDN of the adder circuit 40 select the output nodes NSLP and NSLN of the selector 10, and the switches SEP and SEN select the node of the common voltage VCM. That is, the capacitors CIP and CIN again sample the input voltages (VSLP and VSLN) with reference to the common voltage VCM.

In the sampling period after the second addition operation period, the switches SCP1 and SCN1 of the capacitor array circuits CAP and CAN are on, and the switches SCP2 and SCN2 select the output nodes NDFP and NDFN of the adder circuit 40. As a result, the capacitors CP1 to CP6 and CN1 to CN6 sample the output voltages VDFP and VDFN of the adder circuit 40 with reference to the common voltage VCM.

In the successive approximation operation period after the sampling period, the switches SCP1 and SCN1 of the capacitor array circuits CAP and CAN are off, and the switches SP1 to SP6 and SN1 to SN6 select the voltage VDD or the voltage VSS based on successive approximation data SAD[5:0]. Specifically, when SAD[j]=1, the switch SPj selects the voltage VDD, and the switch SNj selects the voltage VSS. When SAD[j]=0, the switch SPj selects the voltage VSS, and the switch SNj selects the voltage VDD. As a result, the voltages DAQP and DAQN at which DAQP-DAQN=V(SAD[5:0])−(VDFP-VDFN) are output to the sampling nodes NSP and NSN. The comparator circuit 22 determines whether the DAQP-DAQN is positive or negative and outputs the result as the signal CPQ. The control circuit 23 updates the successive approximation data SAD[5:0] based on the signal CPQ. The above operation is repeated successively until the A/D conversion result data is determined.

In the quantization error holding period next to the successive approximation operation period, the control circuit 23 outputs the A/D conversion result data as successive approximation data SAD[5:0]. As a result, the voltages EPi and ENi corresponding to the quantization error in the k-th A/D conversion on the voltage VIi are output to the sampling nodes NSP and NSN. The switches SAPi and SANi of the quantization error hold circuits QEHP and QEHN select the sampling nodes NSP and NSN, and the switches SBPi and SBNi select the node of the common voltage VCM. As a result, the capacitors CEPi and CENi hold charges corresponding to the quantization error in the k-th A/D conversion on the voltage VIi. That is, the capacitors CEPi and CENi hold the voltages EPi and ENi with reference to the common voltage VCM. However, the voltages at which the voltages EPi and ENi are attenuated are held as described in the following equation (2).

After the quantization error holding period, the k-th A/D conversion is performed on a voltage VIi+1. After the k-th A/D conversion on the voltage VIn is completed, (k+1)th A/D conversion is performed on the voltage VI1.

In the above operation, the output voltage of the adder circuit 40 is expressed by the following equation (2). k represents the voltage at the k-th A/D conversion operation. VDF(k) is VDFP-VDFN after the second addition operation period. CI is the capacitance value of the capacitor CIP, and the capacitance value of the capacitor CIN is also CI. CF is the capacitance value of the capacitor CFP, and the capacitance value of the capacitor CFN is also CF. VSL (k) is VSLP-VSLN after the first addition operation period. CE is the capacitance value of the capacitor CEPi, and the capacitance value of the capacitor CENi is also CE. Ctotal is the sum of the capacitance values of the capacitors CP1 to CP6. E(k−1) is EPi-ENi in the (k−1)th A/D conversion.

$$VDF(k) = \frac{CI}{CF} \times VSL(k) - \frac{CE}{CF} \times \frac{Ctotal}{Ctotal + CE} \times E(k-1) \quad (2)$$

In the above equation (2), the capacitance values CE, CF, and Ctotal are set so that the gain of E(k−1) becomes −1. E(k−1) is attenuated with the gain Ctotal/(Ctotal+CE) due to the charge redistribution between the capacitors CP1 to CP6 (Ctotal) and the capacitor CEPi (CE) and the charge redistribution between the capacitors CN1 to CN6 (Ctotal) and the capacitor CENi (CE). When the adder circuit 40 performs addition operation, a gain CE/CF is multiplied, and therefore the attenuated E(k−1) may be amplified. As a result, it is possible to set the gain of E(k−1) to −1, and it is possible to realize a transfer function having noise shaping characteristics like the above equation (1).

According to the present embodiment described above, the switch SAPi connects one end of the capacitor CEPi to the sampling node NSP and the switch SBPi connects the other end of the capacitor CEPi to the node of the common voltage VCM, whereby the capacitor CEPi may hold the charge corresponding to the quantization error. Similarly, the switch SANi connects one end of the capacitor CENi to the sampling node NSN and the switch SBNi connects the other end of the capacitor CENi to the node of the common voltage VCM, whereby the capacitor CENi may hold the charge corresponding to the quantization error. Then, the switch SAPi connects one end of the capacitor CEPi to the node of the common voltage VCM and the switch SBPi connects the other end of the capacitor CEPi to the inverting input node NIN of the operational amplifier AMP, whereby the charge held by the capacitor CEPi is redistributed among the capacitors CEPi and CFN. The switch SANi connects one end of the capacitor CENi to the node of the common voltage VCM and the switch SBNi connects the other end of the capacitor CENi to the non-inverting input node NIP of the operational amplifier AMP, whereby the charge held by the capacitor CENi is redistributed among the capacitors CENi and CFP. As a result, the voltage corresponding to the quantization error may be subtracted from the input voltages (VSLP and VSLN) of the A/D converter circuit 20.

6. Chopping Modulation

Figure 10:
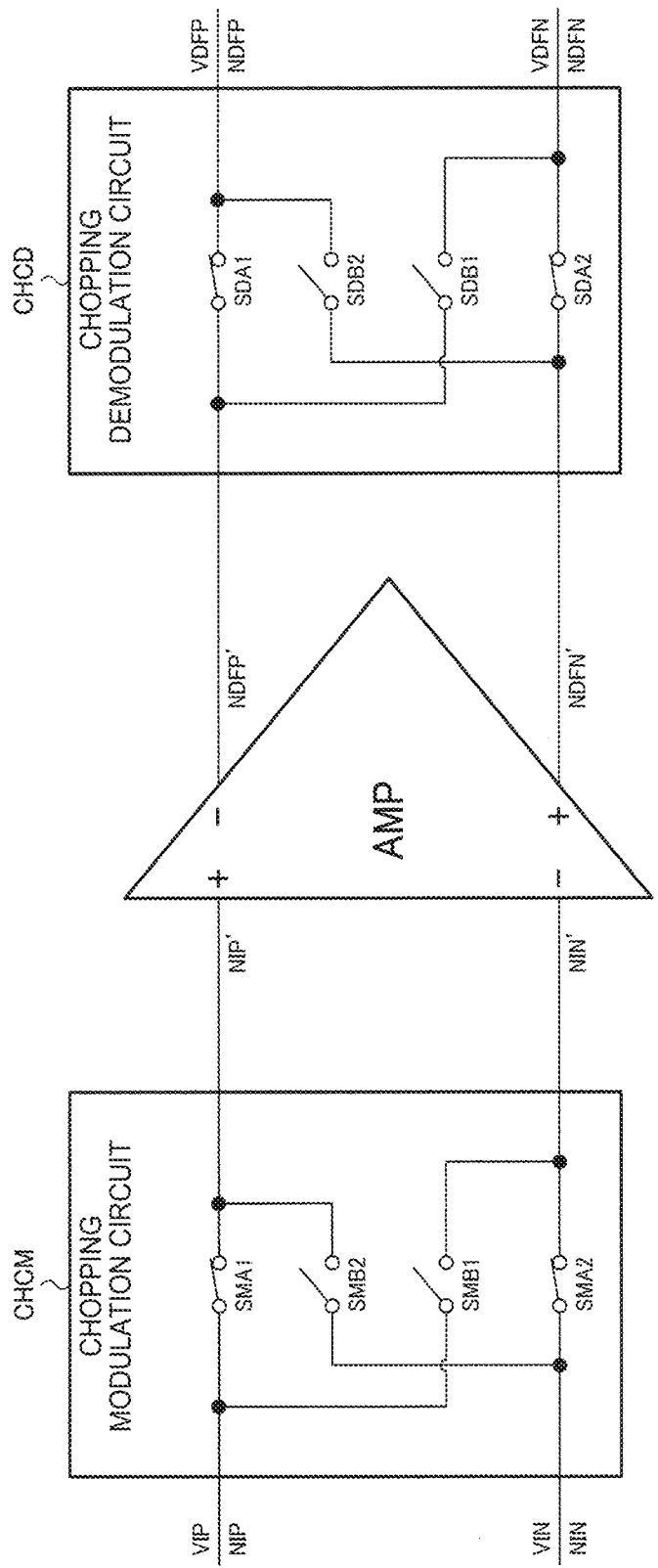
FIG. 10 is a configuration example of a chopping modulation circuit and a chopping demodulation circuit in the case of performing chopping modulation in an adder circuit.

FIG. 10 shows a configuration example of a chopping modulation circuit and a chopping demodulation circuit in a case where chopping modulation is performed in the adder circuit 40. In FIG. 10, the adder circuit 40 includes a chopping modulation circuit CHCM and a chopping demodulation circuit CHCD. In the case of applying the configuration of FIG. 10 to FIG. 8, the nodes NIP, NIN, NDFP, and NDFN of FIG. 10 correspond to the nodes NIP, NIN, NDFP, and NDFN of FIG. 8.

The chopping modulation circuit CHCM performs chopping modulation on the voltage input to a non-inverting input node NIP' and an inverting input node NIN' of the operational amplifier AMP. That is, the chopping modulation circuit CHCM performs chopping modulation on the voltages VIP and VIN of the nodes NIP and NIN and outputs the modulated voltages to the nodes NIP' and NIN'.

The chopping modulation circuit CHCM includes switches SMA1, SMA2, SMB1, and SMB2. One ends of the switches SMA1 and SMB1 are connected to the node NIP, and one ends of the switches SMA2 and SMB2 are connected to the node NIN. The other ends of the switches SMA1 and SMB2 are connected to the node NIP', and the other ends of the switches SMA2 and SMB1 are connected to the node NIN'. The switches SMA1, SMA2, SMB1, and SMB2 are, for example, analog switches consisting of transistors. In the non-inverting operation, the switches SMA1 and SMA2 are on, the switches SMB1 and SMB2 are off, and voltages VIP and VIN are input to the nodes NIP' and NIN'. In the inverting operation, the switches SMA1 and SMA2 are off, the switches SMB1 and SMB2 are on, and the voltages VIN and VIP are input to the nodes NIP' and NIN'.

The chopping demodulation circuit CHCD performs chopping demodulation on the voltages output from the inverting output node NDFP' and the non-inverting output node NDFN' of the operational amplifier AMP. That is, the chopping demodulation circuit CHCD performs chopping demodulation on the voltages of the nodes NDFP' and NDFN' to output the demodulated voltages VDFP and VDFN to the nodes NDFP and NDFN.

The chopping demodulation circuit CHCD includes switches SDA1, SDA2, SDB1, and SDB2. One ends of the switches SDA1 and SDB1 are connected to the node NDFP', and one ends of the switches SDA2 and SDB2 are connected to the node NDFN'. The other ends of the switches SDA1 and SDB2 are connected to the node NFDF, and the other ends of the switches SDA2 and SDB1 are connected to the node NDFN. In the non-inverting operation, the switches SDA1 and SDA2 are on, the switches SDB1 and SDB2 are off, and the voltages of the nodes NDFP' and NDFN' are output to the nodes NDFP and NDFN as the voltages VDFP and VDFN. The switches SDA1, SDA2, SDB1, and SDB2 are, for example, analog switches consisting of transistors. In the inverting operation, the switches SDA1 and SDA2 are off, the switches SDB1 and SDB2 are on, and the voltages of the nodes NDFN' and NDFP' are output to the nodes NDFP and NDFN as the voltages VDFP and VDFN.

The operational amplifier AMP has an offset. For example, an offset is generated between the nodes NIP' and NIN' by making the sizes of the two transistors constructing a differential pair of the operational amplifier AMP different.

The chopping modulation circuit CHCM and the chopping demodulation circuit CHCD alternately repeat the inverting operation and the non-inverting operation. Specifically, one of the inversion operation and the non-inversion operation is performed in the (k−1)th A/D conversion, and the other of the inversion operation and the non-inversion operation is performed in the k-th A/D conversion. As a result, the offset of the operational amplifier AMP is modulated at a chopping frequency. Specifically, the polarity of the offset is inverted between the (k−1)th A/D conversion and the k-th A/D conversion.

Figures 11, 12:
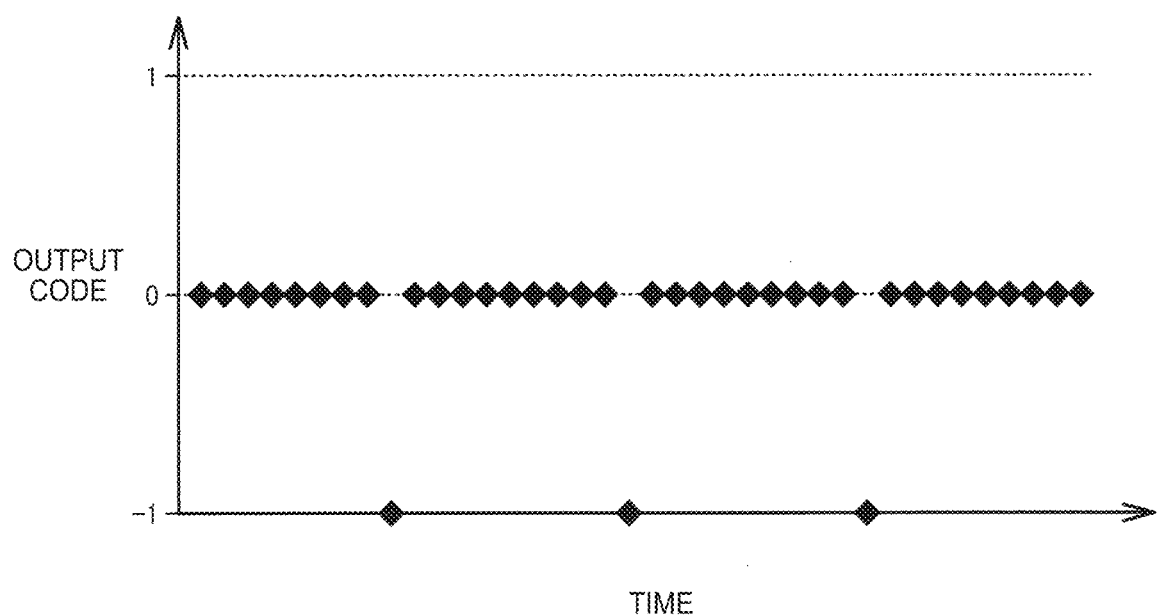
FIG. 11 is an example of temporal change of A/D conversion result data (output code) when 0 V is input without performing chopping modulation.
FIG. 12 is an example of temporal change in A/D conversion result data (output code) when 0 V is input in the present embodiment.

FIG. 11 shows an example of a temporal change in the A/D conversion result data (output code) when 0 V is input in a case where chopping modulation is not performed. Since the present embodiment has a primary noise shaping mechanism, when a DC signal is input to the A/D converter circuit 20, the A/D converter result data DOUT has a specific time change pattern, and unnecessary frequency components may be generated in the A/D conversion result data DOUT. This phenomenon is called an idle tone. For example, it is assumed that the A/D conversion result data of the temperature detection voltage is used for the temperature compensation processing of the TCXO. At this time, if the A/D conversion result data changes at a constant cycle, the oscillation frequency is corrected at that cycle, which may deteriorate the oscillation characteristics.

FIG. 12 shows an example of a temporal change in the A/D conversion result data (output code) when 0 V is input in the present embodiment. In the present embodiment, since chopping modulation is performed, the polarity of the offset is inverted every A/D conversion. Therefore, the change in the A/D conversion result data due to the offset becomes a high frequency by the frequency of the chopping, and the idle tone as described above may be reduced. For example, in the temperature compensation processing of the TCXO, it is possible to reduce the possibility that the oscillation characteristics are degraded by the idle tone.

7. Vibration Device

Figure 13:
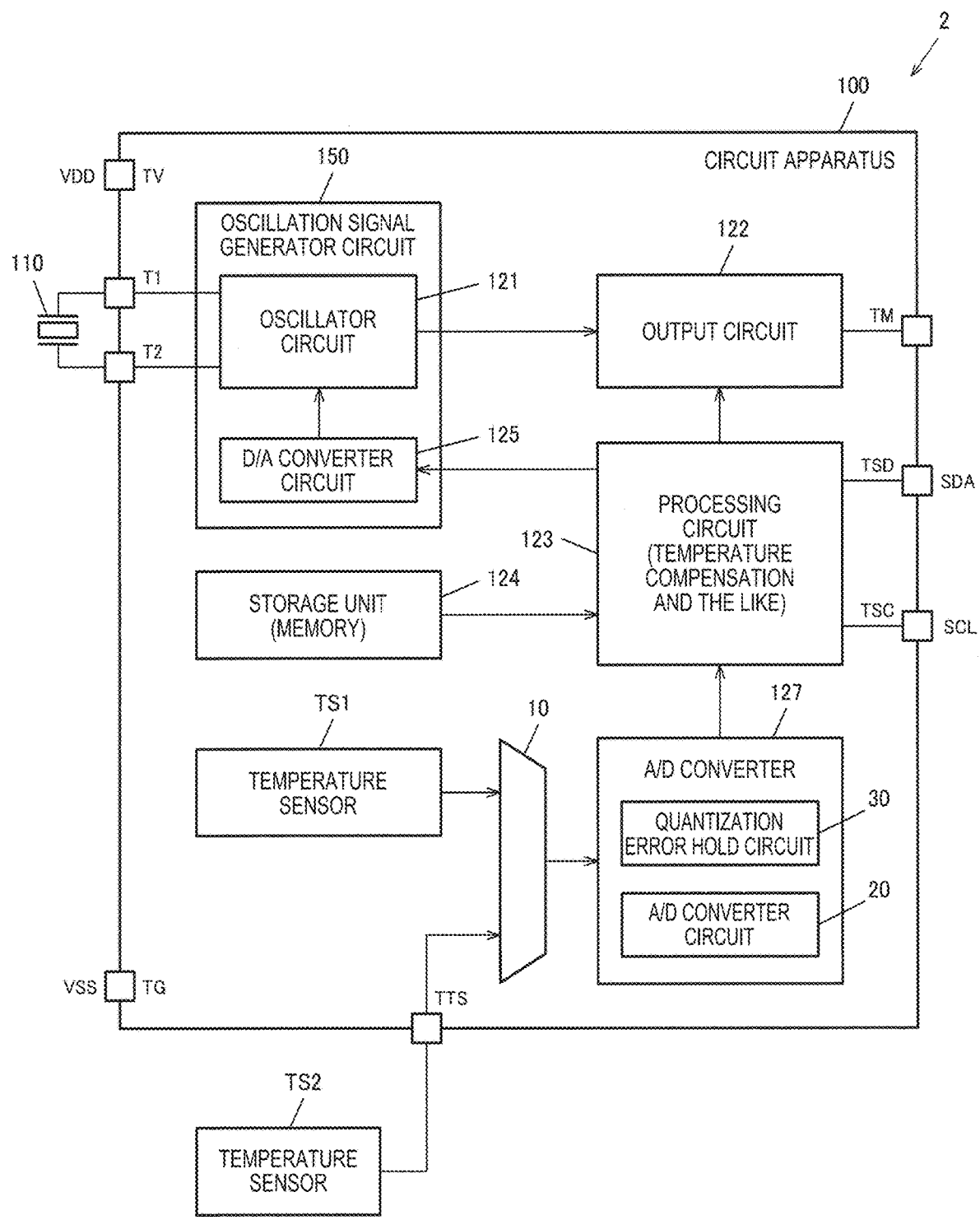
FIG. 13 is a first configuration example of a vibration device including a circuit device.

A configuration example of a vibration device 2 including the circuit device 100 will be described below. FIG. 13 shows a first configuration example of the vibration device 2 including the circuit device 100. In FIG. 13, the case where the vibration device 2 is an oscillator will be described as an example. Specifically, an example of application to TCXO which is a temperature-compensated oscillator will be described. The temperature-compensated oscillator may be an OCXO.

The vibration device 2 (oscillator) includes a vibrator 110 and a circuit device 100. In addition, the vibration device 2 may include a temperature sensor TS2. For example, the vibrator 110, the circuit device 100, and the temperature sensor TS2 are housed in a package, whereby the vibration device 2 is configured.

One end of the vibrator 110 is connected to a terminal T1, and the other end is connected to a terminal T2. The vibrator 110 (resonator) is an element (vibrating element) that generates mechanical vibration by an electric signal. The vibrator 110 may be realized by a vibration piece (piezoelectric vibration piece) such as a crystal vibration piece and the like. For example, the vibrator 110 may be realized by a quartz crystal vibration piece whose cut angle vibrates in thickness shear such as AT cut or SC cut. For example, the vibrator 110 is a vibrator built in a temperature-compensated oscillator (TCXO) without a thermostat. Alternatively, the vibrator 110 may be a vibrator or the like built in an oven controlled crystal oscillator (OCXO) including a thermostat. The vibrator 110 of the present embodiment may be realized by various vibration pieces such as a vibration piece other than a thickness shear vibration type, a piezoelectric vibration piece formed of a material other than quartz. For example, a surface acoustic wave (SAW) resonator, a micro electro mechanical systems (MEMS) vibrator as a silicon vibrator formed by using a silicon substrate, or the like may be adopted as the vibrator 110.

The circuit device 100 includes a processing circuit 123, an oscillation signal generator circuit 150, the selector 10, and an A/D converter 127. In addition, the circuit device 100 includes a storage unit 124 (memory), a temperature sensor TS1 and an output circuit 122, terminals T1 and T2, an output terminal TM, a sensor input terminal TTS, signal terminals TSD and TSC, and power supply terminals TV and TG for power supply. The circuit device 100 is an integrated circuit device (IC, semiconductor chip). The terminals T1 and T2, the output terminal TM, the sensor input terminal TTS, the signal terminals TSD and TSC, and the power supply terminals TV and TG are called pads of an integrated circuit device, for example.

The oscillation signal generator circuit 150 generates an oscillation signal having an oscillation frequency corresponding to the frequency control data by using the vibrator 110. The oscillation signal generator circuit 150 includes an oscillator circuit 121 for oscillating the vibrator 110. In addition, the oscillation signal generator circuit 150 may further include a D/A converter circuit 125 to be described later.

The oscillator circuit 121 includes a drive circuit and is a circuit that oscillates the vibrator 110 by driving the vibrator 110 with the drive circuit via the terminals T1 and T2. As the oscillator circuit 121, for example, a Pierce type oscillator circuit may be adopted. In this case, the drive circuit includes a bipolar transistor and a resistor connected between the base and the collector of the bipolar transistor. The base of the bipolar transistor becomes an input node of the drive circuit and the collector becomes an output node of the drive circuit. A variable capacitance circuit is provided for at least one connection node of the output node and the input node of the drive circuit. The variable capacitance circuit may be realized by a capacitor array or the like in which the number of capacitors connected to the connection node is switched based on a varactor whose capacitance value varies based on the control voltage, and frequency control data, for example.

The output circuit 122 buffers the clock signal which is the output signal from the oscillator circuit 121 and outputs the buffered clock signal to the outside of the circuit device 100 from the output terminal TM. For example, the output circuit 122 is constituted with a buffer circuit that buffers a clock signal which is an output signal from the oscillator circuit 121.

The temperature sensors TS1 and TS2 output temperature-dependent voltages that vary depending on the temperature of the environment (for example, the circuit device 100 and the vibrator 110) as temperature detection voltages. For example, the temperature sensors TS1 and TS2 generate a temperature-dependent voltage by using a circuit element having temperature dependency and output the temperature-dependent voltage with reference to a temperature-independent voltage (for example, band gap reference voltage). For example, the temperature sensors TS1 and TS2 output a forward voltage of the PN junction as a temperature-dependent voltage. The temperature detection voltage from the temperature sensor TS2 is input to the selector 10 via the sensor input terminal TTS.

The selector 10 sequentially selects the temperature detection voltages from the temperature sensors TS1 and TS2 and outputs the time-divided temperature detection voltage to the A/D converter 127. The number of temperature sensors included in the vibration device 2 is not limited to 2, and the vibration device 2 may include first to m-th temperature sensors (m is an integer of 1 to n). At this time, the first to n-th voltages may be input to the selector 10, the first to m-th temperature detection voltages from the first to m-th temperature sensors may be input as first to m-th voltages of the first to n-th voltages. The selector 10 sequentially selects the first to n-th voltages and outputs the time-divided temperature detection voltages to the A/D converter 127.

The A/D converter 127 performs A/D conversion on the output voltage of the selector 10. That is, the A/D converter 127 performs A/D conversion on the temperature detection voltages from the temperature sensors TS1 and TS2 which the selector 10 outputs in a time division manner to output the result as time-division temperature detection data. The A/D converter 127 includes the A/D converter circuit 20 and the quantization error hold circuit 30 described in FIG. 1.

The processing circuit 123 (digital signal processing circuit) performs various signal processing. For example, the processing circuit 123 (temperature compensation unit) performs temperature compensation processing for compensating for the temperature characteristics of the oscillation frequency of the vibrator 110 based on the temperature detection data to output frequency control data for controlling the oscillation frequency. Specifically, the processing circuit 123 performs temperature compensation processing for canceling or reducing the fluctuation of the oscillation frequency due to the temperature change (keeping the oscillation frequency constant even in a case where the temperature changes) based on the temperature detection data (temperature-dependent data) that changes in accordance with the temperature and the coefficient data (coefficient data of approximate function) for temperature compensation processing, and the like. The coefficient data for temperature compensation processing is stored in the storage unit 124. The storage unit 124 may be realized by a semiconductor memory such as a RAM (SRAM and DRAM) or may be realized by a non-volatile memory. The processing circuit 123 may be realized by a digital signal processor (DSP) that executes various signal processing including temperature compensation processing in a time division manner. Alternatively, the processing circuit 123 may be realized by an ASIC circuit based on automatic placement and wiring such as a gate array and may be realized by a processor (for example, CPU, MPU, or the like) and a program operating on the processor. In addition, the processing circuit 123 may perform correction processing (for example, aging correction) other than temperature compensation. In addition, the processing circuit 123 may perform heater control (oven control) of the thermostat in an oven controlled crystal oscillator (OCXO), or the like.

The processing circuit 123 includes an interface circuit that performs serial communication with an external device by using a clock signal SCL and a data signal SDA. The interface circuit is an interface circuit such as I2C or SPI, for example. The signal terminals TSC and TSD are terminals for the clock signal SCL and the data signal SDA.

The D/A converter circuit 125 performs D/A conversion on the frequency control data and outputs a control voltage corresponding to the frequency control data to the oscillator circuit 121. In the variable capacitance circuit provided in the oscillator circuit 121, the capacitance value is variably controlled based on this control voltage. In this case, the variable capacitance circuit may be realized by the above-described varactor and the like.

The power supply voltage VDD on a high potential side is supplied to the power supply terminal TV, and the power supply voltage VSS (for example, ground voltage) on a low potential side is supplied to the power supply terminal TG. The circuit device 100 operates by being supplied with the power supply voltages VDD and VSS.

Figure 14:
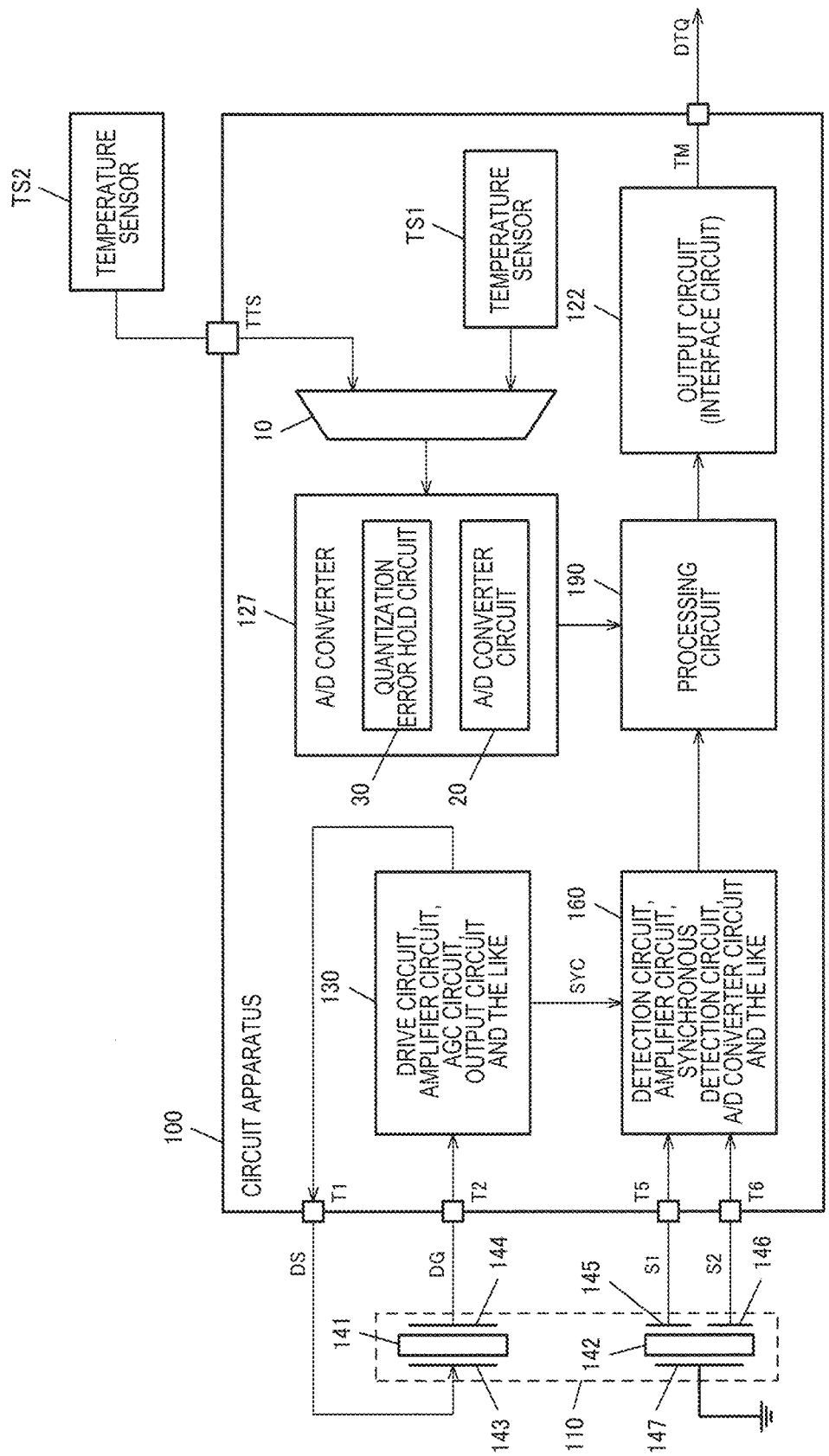
FIG. 14 is a second configuration example of the vibration device including the circuit device.

FIG. 14 shows a second configuration example of the vibration device 2 including the circuit device 100. In FIG. 14, the case where the vibration device 2 is a physical quantity measurement apparatus (physical quantity detection apparatus) for measuring a physical quantity will be described as an example. Various physical quantities such as angular velocity, acceleration, angular acceleration, velocity, distance or time may be assumed as measured physical quantities. In the following, a gyro sensor (vibration gyro sensor) that detects the angular velocity will be described as an example.

The vibration device 2 in FIG. 14 includes the vibrator 110, a circuit device 100, and a temperature sensor TS2. The circuit device 100 includes a drive circuit 130, a detection circuit 160, an output circuit 122, a processing circuit 190, a temperature sensor TS1, the selector 10, an A/D converter 127, terminals T1, T2, T5, and T6, a sensor input terminal TTS, and an output terminal TM.

The vibrator 110 (sensor element and physical quantity transducer) is an element for detecting a physical quantity and includes vibration pieces 141 and 142, drive electrodes 143 and 144, detection electrodes 145 and 146, and a ground electrode 147. The vibration pieces 141 and 142 are piezoelectric vibration pieces formed from a thin plate of a piezoelectric material such as quartz crystal, for example. Specifically, the vibration pieces 141 and 142 are vibration pieces formed of a Z-cut quartz substrate. The piezoelectric material of the vibration pieces 141 and 142 may be a material other than quartz, such as ceramics or silicon.

A drive signal DS (output signal in a broad sense) from the drive circuit 130 of the circuit device 100 is supplied to the drive electrode 143 via the terminal T1, whereby the drive vibration piece 141 vibrates. The vibration piece 141 is, for example, a drive arm of the vibrator 110. A feedback signal DG (input signal in a broad sense) from the drive electrode 144 is input to the drive circuit 130 via the terminal T2. For example, the feedback signal DG resulting from the vibration of the vibration piece 141 is input to the drive circuit 130.

Then, the vibration piece 141 for driving vibrates, whereby the detection vibration piece 142 vibrates. Charges (current) generated by this vibration are input to the detection circuit 160 as detection signals S1 and S2 from the detection electrodes 145 and 146 via the terminals T5 and T6. Here, the ground electrode 147 is set to the ground potential. The detection circuit 160 detects physical quantity information (angular velocity and the like) corresponding to the detection signals S1 and S2 based on these detection signals S1 and S2. Here, the case where the vibrator 110 is a gyro sensor element will be mainly described as an example, but the present embodiment is not limited thereto and the vibrator 110 may be an element for detecting another physical quantity such as acceleration. In addition, as the vibrator 110, for example, a vibration piece having a double T-type structure may be used, but a vibration piece such as a tuning fork type or H type may be used.

The drive circuit 130 may include an amplifier circuit that performs signal amplification by receiving the feedback signal DG from the vibrator 110, an AGC circuit that performs automatic gain control (gain control circuit), an output circuit that outputs the drive signal DS to the vibrator 110, and the like. For example, the AGC circuit variably and automatically adjusts the gain so that the amplitude of the feedback signal DG from the vibrator 110 becomes constant. The AGC circuit may be realized by a full-wave rectifier that performs full-wave rectification of a signal from the amplifier circuit, an integrator that performs integration processing of output signals of the full-wave rectifier, or the like. The output circuit outputs, for example, a rectangular wave drive signal DS. In this case, the output circuit may be realized by a comparator and a buffer circuit. The output circuit may output a sinusoidal drive signal DS. In addition, the drive circuit 130 generates a synchronizing signal SYC based on the output signal of the amplifier circuit, for example, and outputs the signal to the detection circuit 160.

The detection circuit 160 detects the physical quantity information corresponding to the detection signals S1 and S2 based on the detection signals S1 and S2 from the vibrator 110 driven by the drive circuit 130. The detection circuit 160 may include an amplifier circuit, a synchronous detection circuit, an adjustment circuit, and the like. The detection signals S1 and S2 from the vibrator 110 are input to the amplifier circuit via the terminals T1 and T2, and charge-voltage conversion and signal amplification are performed on the detection signals S1 and S2. The detection signals S1 and S2 consist of a differential signal. Specifically, the amplifier circuit may include a first Q/V converter circuit that amplifies the detection signal S1, a second Q/V converter circuit that amplifies the detection signal S2, and a differential amplifier that differentially amplifies output signals of the first and second Q/V converter circuits. The synchronous detection circuit performs synchronous detection by using the synchronization signal SYC from the drive circuit 130. For example, synchronous detection for extracting a desired wave from the detection signals S1 and S2 is performed. The adjustment circuit performs offset adjustment for zero-point correction and gain correction for sensitivity adjustment. In addition, the detection circuit 160 includes an A/D converter circuit. The A/D converter circuit performs A/D conversion on the signal after the synchronous detection and outputs digital detection data as a result thereof to the processing circuit 190. In addition, the detection circuit 160 may include a filter circuit that attenuates unnecessary signals that may not be removed by synchronous detection or the like.

The configurations and operations of the temperature sensors TS1 and TS2, the selector 10, and the A/D converter 127 are the same as those in FIG. 13, and the description thereof will be omitted here.

The processing circuit 190 performs various correction processing such as correction processing for offset adjustment and correction processing for sensitivity adjustment based on the detection data from the detection circuit 160. For example, the processing circuit 190 performs zero-point correction processing of a physical quantity (angular velocity) based on temperature detection data from the A/D converter 127. That is, a correction value for canceling (or reducing) the temperature dependency of the zero point is obtained based on the temperature detection data, and the physical quantity is corrected by the correction value.

The output circuit 122 outputs detection data DTQ after the correction processing from the processing circuit 190 to the outside of the circuit device 100 via the output terminal TM. The output circuit 122 in this case may be realized by an interface circuit such as I2C or SPI, for example.

8. Electronic Apparatus and Vehicle

Figure 15:
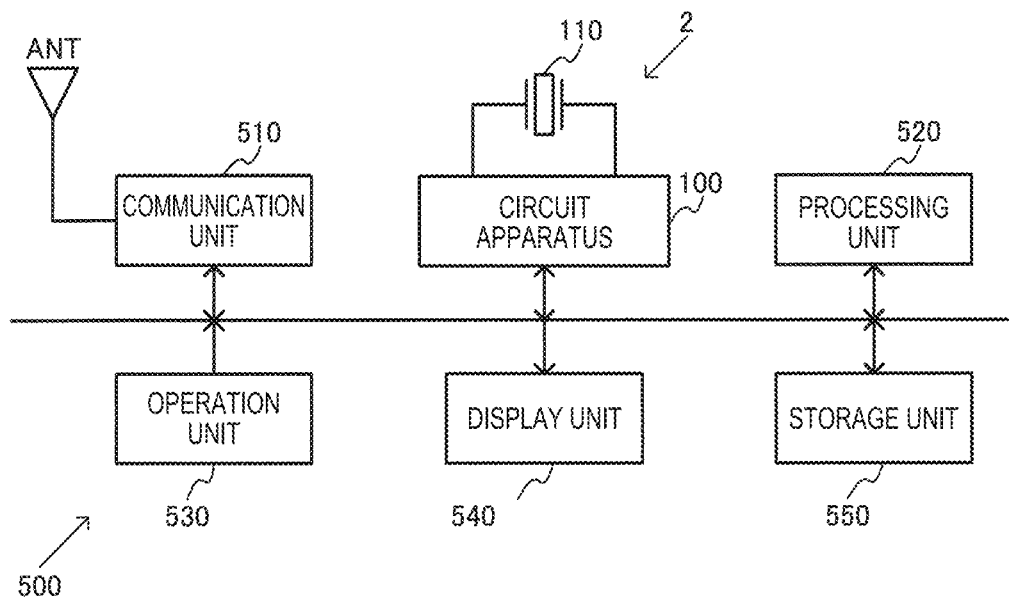
FIG. 15 is a configuration example of an electronic apparatus.

FIG. 15 shows a configuration example of an electronic apparatus 500 including the vibration device 2 (circuit device 100) of the present embodiment. This electronic apparatus 500 includes the vibration device 2 having the circuit device 100 and the vibrator 110, and a processing unit 520. In addition, the electronic apparatus 500 includes a communication unit 510, an operation unit 530, a display unit 540, a storage unit 550, and an antenna ANT.

As the electronic apparatus 500, it is possible to assume network-related equipment such as base stations or routers, high-accuracy measurement equipment that measures physical quantities such as distance, time, flow rate or flow rate, biological information measurement equipment (ultrasonic measurement apparatus, pulse wave meter, blood pressure measurement apparatus, and the like) that measures biological information, in-vehicle equipment (equipment for automatic driving and the like), and the like. In addition, as the electronic apparatus 500, it is possible to assume wearable equipment such as a head mounted type display apparatus or clock related equipment, a robot, a printing apparatus, a projection apparatus, a portable information terminal (smartphone and the like), content providing equipment that distributes content, video equipment such as a digital camera or a video camera, or the like.

The communication unit 510 (communication interface) receives data from the outside via the antenna ANT and performs processing for transmitting data to the outside. The processing unit 520 (processor) performs control processing of the electronic apparatus 500 and various digital processing of data transmitted and received via the communication unit 510. The function of the processing unit 520 may be realized by a processor such as a microcomputer. The operation unit 530 (operation interface) is for the user to perform an input operation and may be realized by an operation button, a touch panel display, or the like. The display unit 540 displays various kinds of information and may be realized by a display such as liquid crystal, organic EL, or the like. The storage unit 550 stores data, and the functions thereof may be realized by a semiconductor memory such as a RAM, ROM, a hard disk drive (HDD), or the like.

Figure 16:
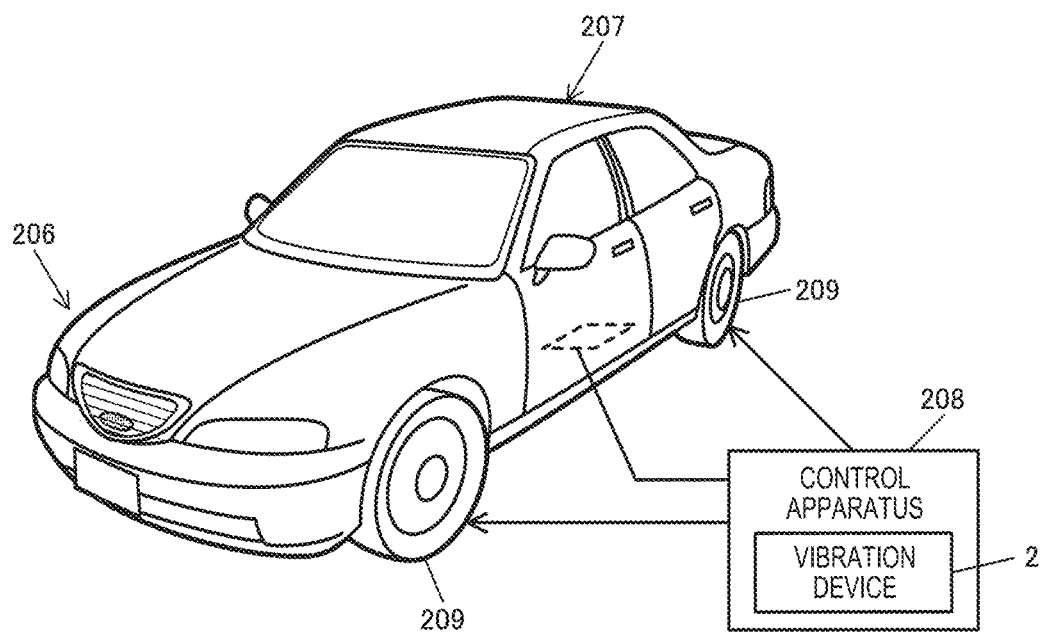
FIG. 16 is an example of a vehicle.

FIG. 16 shows an example of a vehicle including the vibration device 2 (circuit device 100) of the present embodiment. The vibration device 2 (oscillator and physical quantity measurement apparatus) of the present embodiment may be incorporated in various vehicles such as a car, an airplane, a motorbike, a bicycle, a robot, a ship, or the like. The vehicle is an equipment/apparatus that moves on the ground, the sky, or the sea including a drive mechanism such as an engine and a motor, a steering mechanism such as a steering wheel and a rudder, and various kinds of electronic apparatus (in-vehicle equipment). FIG. 16 schematically shows an automobile 206 as a specific example of a vehicle. In the automobile 206, the vibration device 2 of the present embodiment is incorporated. The control apparatus 208 performs various control processing based on the clock signal generated by the vibration device 2 and the measured physical quantity information. For example, in a case where the distance information of the object around the automobile 206 is measured as physical quantity information, the control apparatus 208 performs various control processing for automatic driving by using the measured distance information. The control apparatus 208 controls the hardness of the suspension according to the attitude of a vehicle body 207, for example, or controls the brakes of individual wheels 209. The equipment into which the vibration device 2 of the present embodiment is incorporated is not limited to such a control apparatus 208, and the vibration device 2 may be incorporated in various kinds of equipment provided in a vehicle such as the automobile 206 or a robot.

Although the embodiment has been described in detail as above, but those skilled in the art will easily understand that many modifications may be made without deviating practically from the new matters and effects of the invention. Therefore, all such modification examples are included in the scope of the invention. For example, in the specification or the drawings, terms described with broader or equivalent different terms at least once may be replaced with different terms at any point in the description or drawings. In addition, all combinations of the embodiment and modification examples are included in the scope of the invention. In addition, the configurations, operations, the layout configuration, and the like of the circuit device, the vibration device, the electronic apparatus, the vehicle are not limited to those described in the present embodiment, and various modifications may be made.

The entire disclosure of Japanese Patent Application No. 2017-254043, filed Dec. 28, 2017 is expressly incorporated by reference herein.

What is claimed is:

1. A circuit device comprising:
an A/D converter circuit that includes a charge redistribution type D/A converter circuit and performs A/D conversion of an input voltage by successive approximation using the D/A converter circuit; and
a quantization error hold circuit that holds a charge corresponding to a quantization error in the A/D conversion of the input voltage,
wherein the D/A converter circuit includes
a capacitor array circuit on a positive electrode side, and
a capacitor array circuit on a negative electrode side, the A/D converter circuit includes
a comparator circuit having a first input node connected to a sampling node on the positive electrode side serving as a sampling node of the capacitor array circuit on the positive electrode side and having a second input node connected to a sampling node on the negative electrode side serving as a sampling node of the capacitor array circuit on the negative electrode side,
the quantization error hold circuit includes
a quantization error hold circuit on the positive electrode side having one end connected to the sampling node on the positive electrode side, and
a quantization error hold circuit on the negative electrode side having one end connected to the sampling node on the negative electrode side,
the capacitor array circuit on the positive electrode side and the capacitor array circuit on the negative electrode side are placed along a first direction, and
the quantization error hold circuit on the positive electrode side is placed on a second direction side of the capacitor array circuit on the positive electrode side, and the quantization error hold circuit on the negative electrode side is placed on the second direction side of the capacitor array circuit on the negative electrode side, wherein the second direction is a direction orthogonal to the first direction,
wherein the A/D converter circuit includes an adder circuit that receives an input voltage on the positive electrode side and an input voltage on the negative electrode side as the input voltage, and
the adder circuit outputs a voltage obtained by adding the input voltage on the positive electrode side and a voltage corresponding to a charge held in the quantization error hold circuit on the negative electrode side to the capacitor array circuit on the positive electrode side, and outputs a voltage obtained by adding the input voltage on the negative electrode side and a voltage corresponding to a charge held in the quantization error hold circuit on the positive electrode side to the capacitor array circuit on the negative electrode side.

2. The circuit device according to claim 1,
wherein the comparator circuit is placed between the capacitor array circuit on the positive electrode side and the capacitor array circuit on the negative electrode side.

3. The circuit device according to claim 1,
wherein the adder circuit includes an operational amplifier having an inverting input node connected to another end of the quantization error hold circuit on the positive electrode side and having a non-inverting input node connected to another end of the quantization error hold circuit on the negative electrode side, and
the operational amplifier is placed between the quantization error hold circuit on the positive electrode side and the quantization error hold circuit on the negative electrode side.

4. A circuit device, comprising:
an A/D converter circuit that includes a charge redistribution type D/A converter circuit and performs A/D conversion of an input voltage by successive approximation using the D/A converter circuit;
a quantization error hold circuit that holds a charge corresponding to a quantization error in the A/D conversion of the input voltage,
wherein the D/A converter circuit includes
a capacitor array circuit on a positive electrode side, and
a capacitor array circuit on a negative electrode side, the A/D converter circuit includes a comparator circuit having a first input node connected to a sampling node on the positive electrode side serving as a sampling node of the capacitor array circuit on the positive electrode side and having a second input node connected to a sampling node on the negative electrode side serving as a sampling node of the capacitor array circuit on the negative electrode side, the quantization error hold circuit includes
 a quantization error hold circuit on the positive electrode side having one end connected to the sampling node on the positive electrode side, and
 a quantization error hold circuit on the negative electrode side having one end connected to the sampling node on the negative electrode side, the capacitor array circuit on the positive electrode side and the capacitor array circuit on the negative electrode side are placed along a first direction, and the quantization error hold circuit on the positive electrode side is placed on a second direction side of the capacitor array circuit on the positive electrode side, and the quantization error hold circuit on the negative electrode side is placed on the second direction side of the capacitor array circuit on the negative electrode side, wherein the second direction is a direction orthogonal to the first direction; and a selector that receives first to n-th voltages to output any one of the first to n-th voltages as the input voltage, n being an integer of 2 or more, wherein the quantization error hold circuit on the positive electrode side includes first to n-th hold circuits on the positive electrode side that hold charges corresponding to the first to n-th voltages, and the quantization error hold circuit on the negative electrode side includes first to n-th hold circuits on the negative electrode side that hold charges corresponding to the first to n-th voltages.

5. The circuit device according to claim 4,
wherein the first to n-th hold circuits on the positive electrode side are placed along the second direction, and
the first to n-th hold circuits on the negative electrode side are placed along the second direction.

6. The circuit device according to claim 4,
wherein the A/D converter circuit uses charges held in an i-th hold circuit on the positive electrode side and an i-th hold circuit on the negative electrode side as charges corresponding to a quantization error in (k−1)th A/D conversion of an i-th voltage to perform k-th A/D conversion on the i-th voltage, and outputs A/D conversion result data in which the quantization error is noise-shaped, wherein k is an integer of 2 or more and i is an integer from 1 to n.

7. The circuit device according to claim 4,
wherein first to m-th temperature detection voltages from first to m-th temperature sensors are input to the selector as first to m-th voltages of the first to n-th voltages, wherein m is an integer from 1 to n.

8. A circuit device, comprising:
an A/D converter circuit that includes a charge redistribution type D/A converter circuit and performs A/D conversion of an input voltage by successive approximation using the D/A converter circuit;

a quantization error hold circuit that holds a charge corresponding to a quantization error in the A/D conversion of the input voltage, wherein the D/A converter circuit includes
 a capacitor array circuit on a positive electrode side, and
 a capacitor array circuit on a negative electrode side, the A/D converter circuit includes
 a comparator circuit having a first input node connected to a sampling node on the positive electrode side serving as a sampling node of the capacitor array circuit on the positive electrode side and having a second input node connected to a sampling node on the negative electrode side serving as a sampling node of the capacitor array circuit on the negative electrode side, the quantization error hold circuit includes
 a quantization error hold circuit on the positive electrode side having one end connected to the sampling node on the positive electrode side, and
 a quantization error hold circuit on the negative electrode side having one end connected to the sampling node on the negative electrode side, the capacitor array circuit on the positive electrode side and the capacitor array circuit on the negative electrode side are placed along a first direction, and the quantization error hold circuit on the positive electrode side is placed on a second direction side of the capacitor array circuit on the positive electrode side, and the quantization error hold circuit on the negative electrode side is placed on the second direction side of the capacitor array circuit on the negative electrode side, wherein the second direction is a direction orthogonal to the first direction;

a digital signal processing circuit that outputs frequency control data based on A/D conversion result data corresponding to the input voltage which is a temperature detection voltage; and an oscillation signal generator circuit that generates an oscillation signal of an oscillation frequency corresponding to the frequency control data by using a vibrator.

9. A vibration device comprising:
the circuit device according to claim 1; and
a vibrator that is connected to the circuit device.

10. An electronic apparatus comprising:
the circuit device according to claim 1.

11. A vehicle comprising:
the circuit device according to claim 1.

12. A vibration device comprising:
the circuit device according to claim 4; and
a vibrator that is connected to the circuit device.

13. An electronic apparatus comprising:
the circuit device according to claim 4.

14. A vehicle comprising:
the circuit device according to claim 4.

15. A vibration device comprising:
the circuit device according to claim 8; and
a vibrator that is connected to the circuit device.

16. An electronic apparatus comprising:
the circuit device according to claim 8.

17. A vehicle comprising:
the circuit device according to claim 8.

* * * * *